US012755690B2

(12) United States Patent
Kawashima et al.

(10) Patent No.: US 12,755,690 B2
(45) Date of Patent: Oct. 6, 2026

(54) DISPLAY DEVICE, DISPLAY MODULE, AND ELECTRONIC DEVICE

(71) Applicant: Semiconductor Energy Laboratory Co., Ltd., Atsugi (JP)

(72) Inventors: Susumu Kawashima, Atsugi (JP); Koji Kusunoki, Isehara (JP); Kazunori Watanabe, Machida (JP); Kensuke Yoshizumi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 769 days.

(21) Appl. No.: 17/921,444

(22) PCT Filed: Apr. 30, 2021

(86) PCT No.: PCT/IB2021/053604
§ 371 (c)(1),
(2) Date: Oct. 26, 2022

(87) PCT Pub. No.: WO2021/229350
PCT Pub. Date: Nov. 18, 2021

(65) Prior Publication Data

US 2023/0165055 A1 May 25, 2023

(30) Foreign Application Priority Data

May 14, 2020 (JP) ................................ 2020-085200

(51) Int. Cl.
*G09G 3/3233* (2016.01)
*H10K 59/121* (2023.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC ......... G09G 3/3233; G09G 2300/0842; G09G 2320/0295; G09G 2300/0426;
(Continued)

(56) References Cited

U.S. PATENT DOCUMENTS 4,857,677 A * 8/1989 Tanaka .................... G05G 1/10 200/17 R
7,190,336 B2 3/2007 Fujisawa
(Continued)

FOREIGN PATENT DOCUMENTS

CN 105825815 A 8/2016
CN 109872692 A 6/2019
(Continued)

OTHER PUBLICATIONS

International Search Report (Application No. PCT/IB2021/053604) Dated Jul. 20, 2021.
(Continued)

*Primary Examiner* — Chad M Dicke
*Assistant Examiner* — Gary Abel
(74) *Attorney, Agent, or Firm* — Eric J. Robinson; Robinson Intellectual Property Law Office, P.C.

(57) ABSTRACT

The display device includes first to fourth switches, a first transistor, a capacitor, and a light-emitting/receiving element. The first switch is connected to a gate of the first transistor. The second switch is connected to one of a source and a drain of the first transistor. An anode of the light-emitting/receiving element is connected to the other of the source and the drain of the first transistor through the third switch. The fourth switch is connected to the other of the source and the drain of the first transistor. One electrode of the capacitor is connected to the gate of the first transistor, and the other electrode of the capacitor is connected to the other of the source and the drain of the first transistor. The
(Continued)

light-emitting/receiving element emits light of a first color, receives light of a second color, and converts the light into an electric signal.

12 Claims, 28 Drawing Sheets

(51) Int. Cl.
*H10K 59/131* (2023.01)
*H10K 59/35* (2023.01)
*H10K 59/65* (2023.01)

(52) U.S. Cl.
CPC ......... *H10K 59/131* (2023.02); *H10K 59/352* (2023.02); *H10K 59/353* (2023.02); *H10K 59/65* (2023.02)

(58) Field of Classification Search
CPC ........... H10K 59/1213; H10K 59/1216; H10K 59/131; H10K 59/352; H10K 59/353; H10K 59/121; H10K 65/00; H10K 50/805; H10K 39/34; H10K 59/00–95; G06F 3/041; G06F 3/042; G09F 9/00; G09F 9/30; G09F 9/302; G09F 9/335
See application file for complete search history.

(56) References Cited

U.S. PATENT DOCUMENTS

| | | | | |
|---|---|---|---|---|
| 7,595,775 | B2 | 9/2009 | Osame et al. | |
| 7,969,390 | B2 | 6/2011 | Yoshida | |
| 8,373,696 | B2 | 2/2013 | Miyazawa | |
| 8,519,628 | B2 | 8/2013 | Fukumoto et al. | |
| 8,633,872 | B2 | 1/2014 | Osame | |
| 8,988,400 | B2 | 3/2015 | Shishido | |
| 9,088,006 | B2 | 7/2015 | Yamazaki et al. | |
| 9,666,655 | B2 | 5/2017 | Miyake | |
| 10,007,161 | B2 | 6/2018 | Miyake | |
| 10,483,293 | B2 | 11/2019 | Miyake | |
| 10,490,130 | B2 | 11/2019 | Okamoto | |
| 11,087,684 | B1 * | 8/2021 | Hsiao | G09G 3/3233 |
| 11,217,173 | B2 | 1/2022 | Okamoto | |
| 11,263,937 | B2 | 3/2022 | Wang et al. | |
| 11,468,835 | B2 | 10/2022 | Ma | |
| 12,096,659 | B2 | 9/2024 | Kamada et al. | |
| 2003/0178551 | A1 | 9/2003 | Ozawa | |
| 2005/0057459 | A1 | 3/2005 | Miyazawa | |
| 2005/0264227 | A1 | 12/2005 | Tateuchi | |
| 2006/0017717 | A1 | 1/2006 | Tateuchi | |
| 2008/0252223 | A1 * | 10/2008 | Toyoda | G09G 3/3225 315/169.3 |
| 2009/0079345 | A1 * | 3/2009 | Inuiya | H10K 59/805 313/523 |
| 2011/0043464 | A1 * | 2/2011 | Lee | G06F 3/042 345/173 |
| 2014/0055042 | A1 | 2/2014 | Tateuchi | |
| 2015/0103037 | A1 * | 4/2015 | Wu | G06F 3/0412 345/80 |
| 2016/0293676 | A1 * | 10/2016 | Komatsu | H10K 71/135 |
| 2017/0269783 | A1 | 9/2017 | Yang et al. | |
| 2018/0151656 | A1 | 5/2018 | Choo et al. | |
| 2018/0233089 | A1 | 8/2018 | Okamoto | |
| 2018/0254422 | A1 * | 9/2018 | Wang | H10K 50/13 |
| 2020/0185429 | A1 | 6/2020 | Kimura | |
| 2020/0210010 | A1 * | 7/2020 | Kim | G09G 3/3233 |
| 2021/0035500 | A1 * | 2/2021 | Nishiyama | G09G 3/3233 |
| 2021/0098537 | A1 * | 4/2021 | Krah | G06F 3/0412 |
| 2021/0125533 | A1 * | 4/2021 | Wang | G09G 3/006 |
| 2021/0343990 | A1 * | 11/2021 | Du | H10K 59/8792 |
| 2021/0358410 | A1 | 11/2021 | Inoue et al. | |
| 2022/0336570 | A1 | 10/2022 | Nakagawa et al. | |
| 2024/0397755 | A1 | 11/2024 | Kamada et al. | |

FOREIGN PATENT DOCUMENTS

| | | | |
|---|---|---|---|
| CN | 110634432 | A | 12/2019 |
| EP | 3723077 | A | 10/2020 |
| JP | 07-175420 | A | 7/1995 |
| JP | 2004-127272 | A | 4/2004 |
| JP | 2005-009972 | A | 1/2005 |
| JP | 2005-099772 | A | 4/2005 |
| JP | 2005-148285 | A | 6/2005 |
| JP | 2005-338428 | A | 12/2005 |
| JP | 2006-030855 | A | 2/2006 |
| JP | 2006-260927 | A | 9/2006 |
| JP | 2006-267696 | A | 10/2006 |
| JP | 2010-034164 | A | 2/2010 |
| JP | 2013-057726 | A | 3/2013 |
| JP | 2014-197522 | A | 10/2014 |
| JP | 2018-159912 | A | 10/2018 |
| KR | 2016-0049586 | A | 5/2016 |
| KR | 2018-0092840 | A | 8/2018 |
| WO | WO-2020/053692 | | 3/2020 |
| WO | WO-2021/130581 | | 7/2021 |
| WO | WO-2021/220141 | | 11/2021 |

OTHER PUBLICATIONS

Written Opinion (Application No. PCT/IB2021/053604) Dated Jul. 20, 2021.

* cited by examiner

Data writing period

Holding and light-emitting period

Reset period

Light exposure period

Transfer period

Reading period

Data writing period

Holding and light-emitting period

Reset period

Light exposure period

Transfer period

Reading period

30

DISPLAY DEVICE, DISPLAY MODULE, AND ELECTRONIC DEVICE

TECHNICAL FIELD

One embodiment of the present invention relates to a display device. One embodiment of the present invention relates to an image capturing device. One embodiment of the present invention relates to a display device having an image capturing function.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, display devices have been required to have higher definition in order to display high-resolution images. In addition, display devices used in information terminal devices such as smartphones, tablet terminals, and laptop PCs (personal computers) have been required to have lower power consumption as well as higher definition. Furthermore, display devices have been required to have a variety of functions such as a function of a touch panel and a function of capturing images of fingerprints for authentication in addition to a function of displaying images.

Light-emitting devices including light-emitting elements have been developed, for example, as display devices. Light-emitting elements utilizing an electroluminescence (hereinafter referred to as EL) phenomenon (also referred to as EL elements) have features such as ease of reduction in thickness and weight, high-speed response to an input signal, and driving with a direct-current constant voltage power source, and have been used in display devices. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display device having an image capturing function. An object of one embodiment of the present invention is to provide an image capturing device or a display device including a high-definition display portion or an image capturing portion. An object of one embodiment of the present invention is to provide an image capturing device or a display device capable of capturing a high-definition image. An object of one embodiment of the present invention is to provide an image capturing device or a display device capable of image capturing with high sensitivity. An object of one embodiment of the present invention is to provide a display device capable of obtaining biological information such as fingerprints. An object of one embodiment of the present invention is to provide a display device functioning as a touch panel.

An object of one embodiment of the present invention is to reduce the number of components of an electronic device. An object of one embodiment of the present invention is to provide a display device, an image capturing device, an electronic device, or the like that has a novel structure. An object of one embodiment of the present invention is to reduce at least one of problems of the conventional technique.

Note that the description of these objects does not preclude the existence of other objects. One embodiment of the present invention does not necessarily achieve all these objects. Objects other than these can be derived from the description of the specification, the drawings, the claims, and the like.

Means for Solving the Problems

One embodiment of the present invention is a display device including first to third switches, a first transistor, a capacitor, a light-emitting/receiving element, and first to third wirings. The first wiring is electrically connected to a gate of the first transistor through the first switch. The second wiring is electrically connected to one of a source and a drain of the first transistor through the second switch. An anode of the light-emitting/receiving element is electrically connected to the other of the source and the drain of the first transistor through the third switch, and a cathode of the light-emitting/receiving element is electrically connected to the third wiring. One electrode of the capacitor is electrically connected to the gate of the first transistor, and the other electrode of the capacitor is electrically connected to the other of the source and the drain of the first transistor. A first potential is supplied to the second wiring, a second potential lower than the first potential is supplied to the third wiring, and the light-emitting/receiving element has a function of emitting light of a first color and a function of receiving light of a second color and converting the light into an electric signal.

One embodiment of the present invention is a display device including first to fourth switches, a first transistor, a capacitor, a light-emitting/receiving element, and first to fourth wirings. The first wiring is electrically connected to a gate of the first transistor through the first switch. The second wiring is electrically connected to one of a source and a drain of the first transistor through the second switch. An anode of the light-emitting/receiving element is electrically connected to the other of the source and the drain of the first transistor through the third switch, and a cathode of the light-emitting/receiving element is electrically connected to the third wiring. The fourth wiring is electrically connected to the other of the source and the drain of the first transistor through the fourth switch. One electrode of the capacitor is electrically connected to the gate of the first transistor, and the other electrode of the capacitor is electrically connected to the other of the source and the drain of the first transistor. A first potential is supplied to the second wiring, and a second potential lower than the first potential is supplied to the third wiring. The light-emitting/receiving element has a function of emitting light of a first color and a function of receiving light of a second color and converting the light into an electric signal.

In the above, it is preferable that the first to fourth switches be in a conducting state, a data potential be supplied to the first wiring, and a third potential be supplied to the fourth wiring in a first period. In addition, the first to fourth switches are preferably in a non-conducting state in a second period.

In any of the above, it is preferable that the first switch, the third switch, and the fourth switch be in a conducting state, the second switch be in a non-conducting state, a fourth potential lower than the first potential be supplied to the first wiring, and a fifth potential lower than the second potential be supplied to the fourth wiring in a third period. Furthermore, it is preferable that the first switch and the third switch be in a conducting state, the second switch and the fourth switch be in a non-conducting state, and a sixth potential higher than the second potential be supplied to the first wiring in a fourth period. Furthermore, it is preferable that the first switch and the third switch be in a non-conducting state, and the second switch and the fourth switch be in a conducting state in a fifth period.

Another embodiment of the present invention is a display device including first to fifth transistors, a capacitor, a light-emitting/receiving element, and first to fourth wirings. One of a source and a drain of the second transistor is electrically connected to the first wiring, and the other of the source and the drain of the second transistor is electrically connected to a gate of the first transistor. One of a source and a drain of the third transistor is electrically connected to the second wiring, and the other of the source and the drain of the third transistor is electrically connected to one of a source and a drain of the first transistor. One of a source and a drain of the fourth transistor is electrically connected to the other of the source and the drain of the first transistor, and the other of the source and the drain of the fourth transistor is electrically connected to an anode of the light-emitting/receiving element. A cathode of the light-emitting/receiving element is electrically connected to the third wiring. One of a source and a drain of the fifth transistor is electrically connected to the other of the source and the drain of the first transistor, and the other of the source and the drain of the fifth transistor is electrically connected to the fourth wiring. One electrode of the capacitor is electrically connected to the gate of the first transistor, and the other electrode of the capacitor is electrically connected to the other of the source and the drain of the first transistor. A first potential is supplied to the second wiring, and a second potential lower than the first potential is supplied to the third wiring. The light-emitting/receiving element has a function of emitting light of a first color and a function of receiving light of a second color and converting the light into an electric signal.

In the above, it is preferable that one or more of the first to fifth transistors include a gate and a back gate, and the same potential be supplied to the gate and the back gate.

In the above, a light-emitting element having a function of emitting light of the second color is preferably included. In that case, it is further preferable that the light-emitting/receiving element and the light-emitting element be provided on one plane.

In the above, the light-emitting/receiving element preferably includes a first pixel electrode, a first light-emitting layer, an active layer, and a first electrode. Furthermore, the light-emitting element preferably includes a second pixel electrode, a second light-emitting layer, and the first electrode. In that case, the first pixel electrode and the second pixel electrode are preferably formed by processing the same conductive film.

Another embodiment of the present invention is a display module including any of the above-described display devices, and a connector or an integrated circuit.

Another embodiment of the present invention is an electronic device including the above-described display module and at least one of an antenna, a battery, a housing, a camera, a speaker, a microphone, a touch sensor, and an operation button.

Effect of the Invention

According to one embodiment of the present invention, a display device having an image capturing function can be provided. An image capturing device or a display device having a display portion or an image capturing portion can be provided. An image capturing device or a display device capable of capturing high-definition images can be provided. An image capturing device or a display device capable of high-sensitivity image capturing can be provided. A display device capable of obtaining biological information such as fingerprints can be provided. A display device functioning as a touch panel can be provided.

According to one embodiment of the present invention, the number of components of an electronic device can be reduced. Alternatively, a display device, an image capturing device, an electronic device, or the like having a novel structure can be provided. Alternatively, at least one of problems of the conventional technique can be reduced.

Note that the description of these effects does not preclude the existence of other effects. One embodiment of the present invention does not necessarily have all these effects. Note that effects other than these can be derived from the description of the specification, the drawings, the claims, and the like.

MODE FOR CARRYING OUT THE INVENTION

Figure 1:
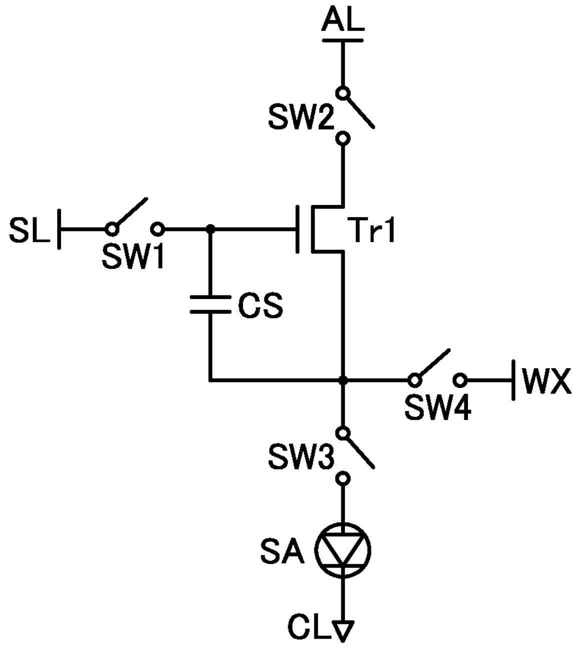
FIG. 1 is a circuit diagram illustrating an example of a pixel.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number of components.

A transistor is a kind of semiconductor elements and can achieve amplification of current or voltage, switching operation for controlling conduction or non-conduction, or the like. An IGFET (Insulated Gate Field Effect Transistor) and a thin film transistor (TFT) are in the category of transistors in this specification.

Functions of a "source" and a "drain" are sometimes replaced with each other when a transistor of opposite polarity is used or when the direction of current is changed in circuit operation, for example. Therefore, the terms "source" and "drain" can be switched in this specification.

In this specification and the like, the expression "electrically connected" includes the case where components are connected through an "object having any electric function". There is no particular limitation on the "object having any electric function" as long as electric signals can be transmitted and received between components that are connected through the object. Examples of the "object having any electric function" include a switching element such as a transistor, a resistor, a coil, a capacitive element, and other elements with a variety of functions as well as an electrode and a wiring.

Note that in this specification and the like, a node is an element (e.g., a wiring and the like) that enables electrical connection between elements included in a circuit. Thus, a "node to which A is connected" is a wiring that is electrically connected to A and can be regarded as having the same potential as A. Note that even when one or more elements which enable electrical connection (e.g., switches, transistors, capacitive elements, inductors, resistors, diodes, and the like) are inserted in a portion of the wiring, the wiring can be regarded as the node to which A is connected as long as it has the same potential as A.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor that detects the contact, press, approach, or the like of a detecting target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector, an IC, or the like is mounted is referred to as a touch panel module, a display module, or simply a touch panel or the like in some cases.

Embodiment 1

Described in this embodiment are a structure example and a driving method example of a display device of one embodiment of the present invention.

One embodiment of the present invention is a display device including a plurality of pixels arranged in a matrix.

Each of the pixels includes one or more subpixels. Each of the subpixels includes one or more light-emitting/receiving elements.

A light-emitting/receiving element (a light-emitting/receiving device) is an element having a function of a light-emitting element (also referred to as a light-emitting device) that emits light of a first color, and a function of a photoelectric conversion element (also referred to as a photoelectric conversion device) that receives light of a second color and converts the light into an electric signal. The light-emitting/receiving element can also be referred to as a multifunctional element, a multifunctional diode, a light-emitting photodiode, a bidirectional photodiode, or the like.

A plurality of subpixels each including the light-emitting/receiving element are arranged in a matrix, whereby the display device can have a function of displaying images and a function of capturing images. Thus, the display device can also be referred to as a complex device or a multifunctional device.

Configuration Example 1

FIG. 1 illustrates part of a pixel circuit that can be used for the subpixel including a light-emitting/receiving element. The pixel circuit includes a switch SW1, a switch SW2, a switch SW3, a switch SW4, a transistor Tr1, and a light-emitting/receiving element SA. Moreover, the pixel circuit preferably includes a capacitor CS as a capacitor for holding electric charge. A wiring SL, a wiring AL, a wiring CL, and a wiring WX are connected to the pixel circuit.

The switch SW1, the switch SW2, the switch SW3, and the switch SW4 are each an element that includes two terminals (electrodes) and can control electrical continuity and discontinuity between the terminals.

The wiring SL is electrically connected to a gate of the transistor Tr1 through the switch SW1. The wiring AL is electrically connected to one of a source and a drain of the transistor Tr1 through the switch SW2. An anode of the light-emitting/receiving element SA is electrically connected to the other of the source and the drain of the transistor Tr1 through the switch SW3. A cathode of the light-emitting/receiving element SA is electrically connected to the wiring CL. The wiring WX is electrically connected to the other of the source and the drain of the transistor Tr1 through the switch SW4. One of a pair of electrodes of the capacitor CS is electrically connected to the gate of the transistor Tr1, and the other of the pair of electrodes of the capacitor CS is electrically connected to the other of the source and the drain of the transistor Tr1.

In FIG. 1, the anode of the light-emitting/receiving element SA is positioned on the transistor Tr1 side. In this case, a potential supplied to the wiring CL can be a potential lower than a potential supplied to the wiring AL. Note that the cathode of the light-emitting/receiving element SA may be positioned on the transistor Tr1 side; in that case, the wiring CL can be supplied with a potential higher than the potential supplied to the wiring AL.

Although an example where n-channel type transistors are used as the transistors is illustrated in FIG. 1 and the like, some or all of the transistors can be p-channel type transistors. In that case, a variety of potentials, signals, or the like can be changed as appropriate in accordance with the kinds of transistors.

The transistor Tr1 has a function of controlling a current flowing through the light-emitting/receiving element SA. In other words, the transistor Tr1 has a function of a driving transistor. The transistor Tr1 can control the current flowing through the light-emitting/receiving element SA in accordance with a potential (data potential) supplied from the wiring SL through the switch SW1. The light-emitting/receiving element SA can emit light with luminance corresponding to the current.

The transistor Tr1 has a function of a reading transistor for outputting a signal based on the light exposure state of the light-emitting/receiving element SA. Specifically, a predetermined potential is supplied to the gate of the transistor Tr1 and a potential based on electric charge generated by light received by the light-emitting/receiving element SA is supplied to the source of the transistor Tr1, whereby the conducting state of the transistor Tr1 changes in accordance with a gate-source voltage. The information of the light exposure state of the light-emitting/receiving element SA can be obtained from the current flowing from the wiring AL to the wiring WX through the transistor Tr1. The wiring WX also functions as a reading wiring.

In this manner, one transistor Tr1 can serve as both a driving transistor when the light-emitting/receiving element SA is a light-emitting element and a reading transistor when the light-emitting/receiving element SA is a light-receiving element; as a result, the configuration of the pixel circuit can be simplified. Furthermore, one transistor can be omitted, so that wirings and the like that supply a signal to the transistor can be omitted.

In addition, the capacitor CS functions not only as a storage capacitor when the light-emitting/receiving element SA is a light-emitting element but also as a storage capacitor when the light-emitting/receiving element SA is a light-receiving element.

When a transistor and a capacitor each have a plurality of functions as described above, the area occupied by the pixels can be reduced, achieving a display device with high definition. Therefore, it is possible not only to display images with high display quality but also to capture images with high definition.

An operation method of the pixel circuit illustrated in FIG. 1 will be described below.

First, an example of an operation method in the case where the light-emitting/receiving element SA is used as a light-emitting element is described with reference to FIG. 2A and FIG. 2B.

Figure 2A:
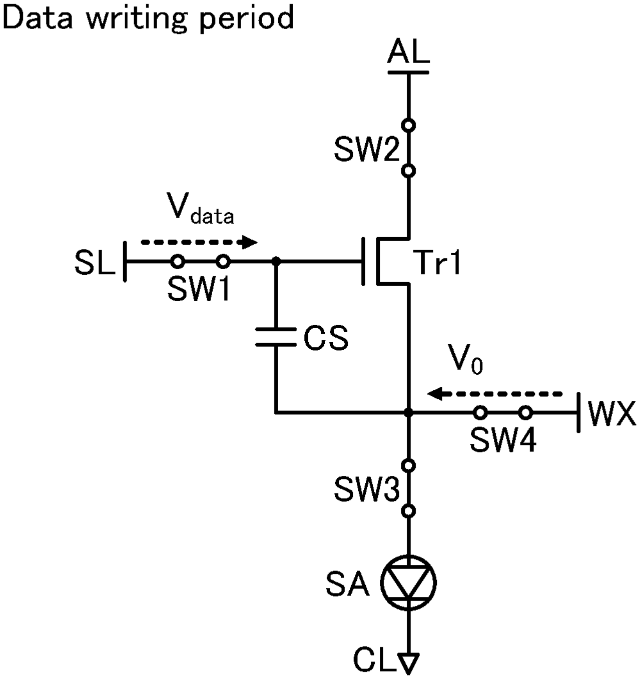
FIG. 2A and FIG. 2B are diagrams illustrating an operation method example of a pixel circuit.

FIG. 2A schematically illustrates an operation in a period during which a data potential $V_{data}$ is written to the gate of the transistor Tr1 (data writing period). In the data writing period, the switch SW1, the switch SW2, the switch SW3, and the switch SW4 are all brought into a conducting state.

In the data writing period, as indicated by one of the dashed line arrows, the data potential $V_{data}$ is supplied to the gate of the transistor Tr1 from the wiring SL through the switch SW1. As indicated by the other of the dashed line arrows, a potential $V_0$ is supplied to the other of the source and the drain of the transistor Tr1 from the wiring WX through the switch SW4. At this time, voltage corresponding to the potential difference between the data potential $V_{data}$ and the potential $V_0$ is charged to a capacitor CS1.

Figure 2B:
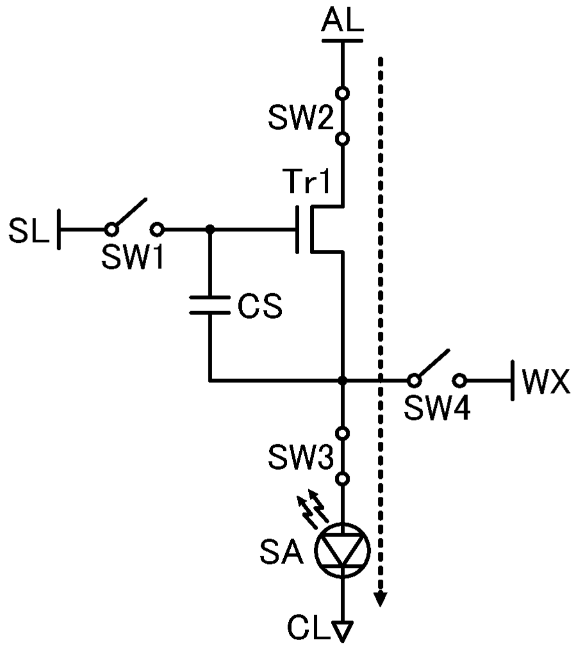

FIG. 2B schematically illustrates an operation in a period during which a gate potential of the transistor Tr1 is held and the light-emitting/receiving element SA emits light in accordance with a current flowing through the transistor Tr1 (holding and light-emitting period). In the holding and light-emitting period, the switch SW1 and the switch SW4 are brought into a non-conducting state, and the switch SW2 and the switch SW3 are brought into a conducting state. Accordingly, almost all of current flowing through the transistor Tr1 flow in the light-emitting/receiving element SA. In FIG. 2B, the path of current is indicated by a dashed line arrow.

Next, an example of an operation method in the case where the light-emitting/receiving element SA is used as a light-receiving element is described with reference to FIG. 3A to FIG. 3D.

Figure 3A:
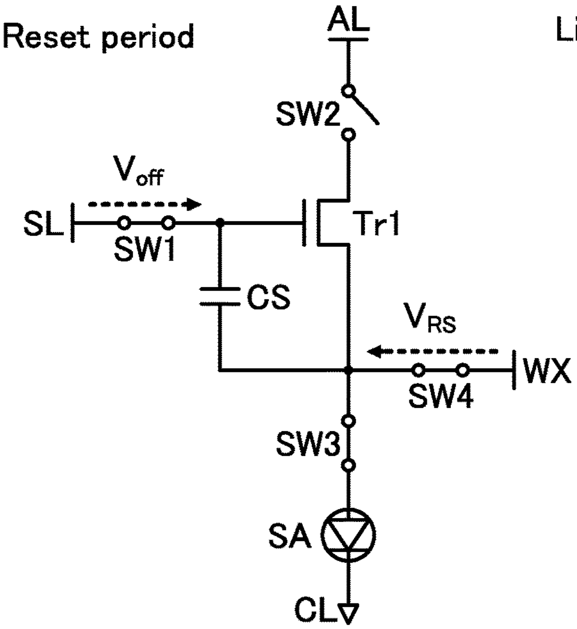
FIG. 3A to FIG. 3D are diagrams illustrating an operation method example of a pixel circuit.

FIG. 3A schematically illustrates an operation in a period during which a potential of the anode of the light-emitting/receiving element SA is initialized (reset period). In the reset period, the switch SW1, the switch SW3, and the switch SW4 are brought into a conducting state, and the switch SW2 is brought into a non-conducting state.

In the reset period, as indicated by one of the dashed line arrows, a potential $V_{RS}$ is supplied to the anode of the light-emitting/receiving element SA from the wiring WX through the switch SW4 and the switch SW3. The potential $V_{RS}$ is also supplied to the other electrode of the capacitor CS through the switch SW4. The potential $V_{RS}$ is a potential at least lower than the potential supplied to the wiring CL. The potential $V_{RS}$ is preferably set potential lower than the potential $V_0$.

Note that in the case where the cathode of the light-emitting/receiving element SA is connected to the transistor Tr1 side, the potential $V_{RS}$ may be potential higher than the potential supplied to the wiring CL (the potential supplied to the anode of the light-emitting/receiving element SA). The potential $V_{RS}$ can be potential higher than the potential $V_0$.

Furthermore, in the reset period, a node to which the gate of the transistor Tr1 is connected is not brought into a floating state but is preferably brought into a state in which a predetermined potential is supplied. For example, in FIG. 3A, a potential $V_{off}$ is supplied to the gate of the transistor Tr1 and one electrode of the capacitor CS from the wiring SL through the switch SW1. The potential $V_{off}$ can be potential lower than the potential supplied to the wiring AL.

The potential $V_{off}$ is preferably set to a potential at which the transistor Tr1 is brought into a non-conducting state. For example, the potential $V_{off}$ can be potential lower than the potential obtained by adding the threshold voltage of the transistor Tr1 to the potential $V_{RS}$. In particular, the potential $V_{off}$ is preferably potential lower than the potential $V_{RS}$.

Figure 3B:
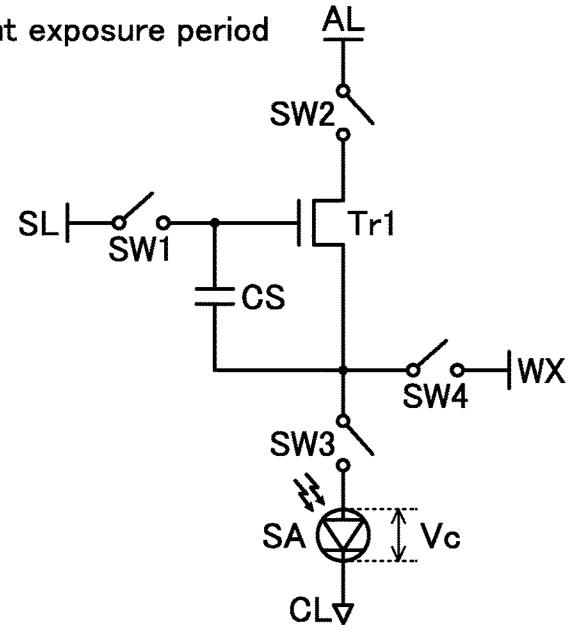

FIG. 3B schematically illustrates an operation in a period during which the light-emitting/receiving element SA receives light and electric charge is accumulated in the light-emitting/receiving element (light exposure period). In the light exposure period, electric charge is accumulated in the light-emitting/receiving element SA, whereby a potential difference Vc between the anode and the cathode of the light-emitting/receiving element SA is changed.

In the light exposure period, the switch SW1, the switch SW2, the switch SW3, and the switch SW4 are all brought into a non-conducting state. The switch SW2 is in a non-conducting state and the potential $V_{off}$ that has been supplied to the gate of the transistor Tr1 is held; thus, the transistor Tr1 is also brought into a non-conducting state. In addition, the switch SW3 is in a non-conducting state; thus, there are two switches in a non-conducting state and one transistor in a non-conducting state between the wiring AL and the light-emitting/receiving element SA. Furthermore, two switches in a non-conducting state (the switch SW3 and the switch SW4) are provided also between the wiring WX and the light-emitting/receiving element SA. Accordingly, it is possible to suitably prevent electric charge accumulated on the anode side of the light-emitting/receiving element SA from flowing to the wiring AL, the wiring WX, or the like. As a result, the light-emitting/receiving element SA enables image capturing with high accuracy to be performed.

Figure 3C:
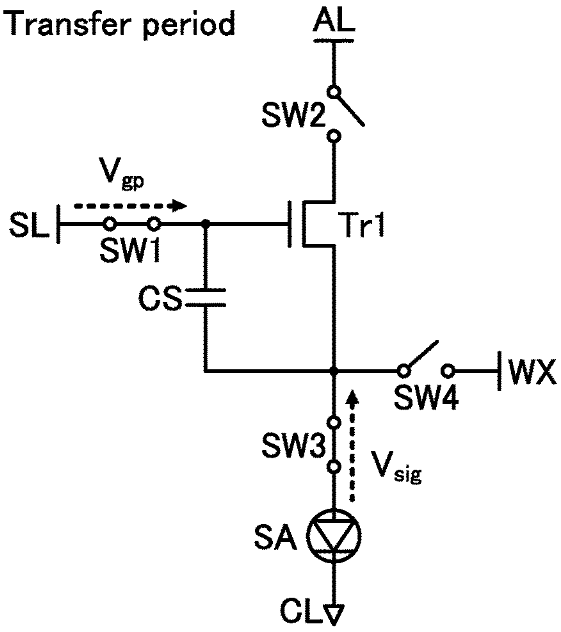

FIG. 3C schematically illustrates an operation in a period during which electric charge accumulated in the light-emitting/receiving element SA is transferred to a node to which the source of the transistor Tr1 is connected (transfer period). In the transfer period, the switch SW1 and the switch SW3 are brought into a conducting state, and the switch SW2 and the switch SW4 are brought into a non-conducting state.

In the transfer period, as indicated by one of the dashed line arrows, electric charge accumulated in the light-emitting/receiving element SA is transferred to a node to which the source of the transistor Tr1 and the other electrode of the capacitor CS are connected through the switch SW3. The potential of the node at the time of completion of transfer is $V_{sig}$.

In addition, in the transfer period, as indicated by the other of the dashed line arrows, a potential $V_{gp}$ is supplied to a node to which the gate of the transistor Tr1 and one electrode of the capacitor CS are connected from the wiring SL through the switch SW1.

After the charge of the capacitor CS is completed, the switch SW1 and the switch SW3 are brought into a non-conducting state, so that the potential of the gate and the potential of the source of the transistor Tr1 are held.

Figure 3D:
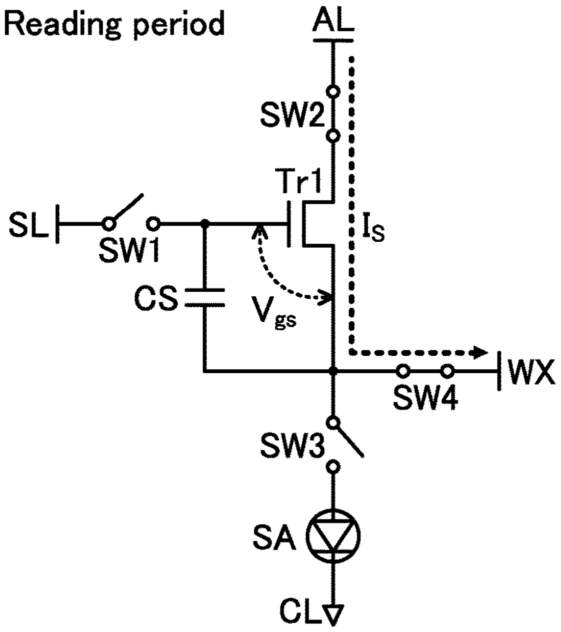

FIG. 3D schematically illustrates an operation in a period during which data is output from the pixel circuit to the wiring WX (reading period). In the reading period, the switch SW1 and the switch SW3 are brought into a non-conducting state, and the switch SW2 and the switch SW4 are brought into a conducting state.

In the reading period, a gate-source voltage $V_{gs}$ of the transistor Tr1 (indicated by a dotted arrow) is represented with the potential $V_{gp}$ and the potential $V_{sig}$ as $V_{gs}=V_{gp}-V_{sig}$. Since the gate-source voltage $V_{gs}$ of the transistor Tr1 is determined, the current flowing through the transistor Tr1 is also determined. For example, in a saturation region, a current Is that is proportional to the square of the voltage obtained by subtracting the threshold voltage $V_{th}$ of the transistor Tr1 from the voltage $V_{gs}$ flows between the source and the drain of the transistor Tr1.

The potential $V_{gp}$ can be set to a potential at which the transistor Tr1 is brought into a conducting state regardless of the value of the potential $V_{sig}$. That is, the value of the potential $V_{gp}$ can be set so that the value of $V_{gs}-V_{th}$ is positive regardless of the value of the potential $V_{sig}$.

In this manner, when one transistor serves as both a driving transistor for display and a reading transistor for capturing images, not only the number of transistors included in the pixel circuit but also the number of wirings and the like connected to the pixel circuit can be reduced, so that the pixel circuit can be simplified. Thus, a display device can easily achieve higher definition and higher resolution. Furthermore, since the number of wirings is reduced, the power consumption of the display device can be reduced.

Modification Example

A configuration example of a pixel circuit in which the number of elements is smaller than that in the above-described configuration will be explained below.

Figure 4A:
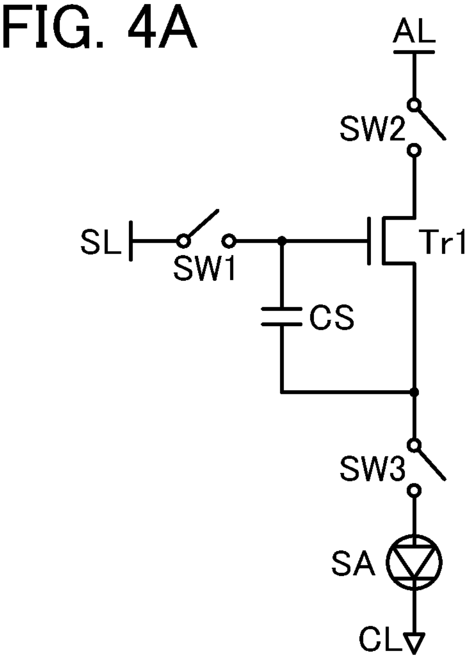
FIG. 4A is a circuit diagram illustrating an example of a pixel.

FIG. 4A illustrates part of a pixel circuit. The pixel circuit illustrated in FIG. 4A includes the switch SW1, the switch SW2, the switch SW3, the transistor Tr1, the capacitor CS, and the light-emitting/receiving element SA. The pixel circuit illustrated in FIG. 4A is different from the configuration illustrated in FIG. 1 mainly in that the switch SW4 is not included and the wiring WX is not included.

The wiring AL also serves a function of the wiring WX described above. That is, the anode potential and the potential $V_{RS}$ are supplied to the wiring AL in different periods. In addition, the wiring AL also functions as a reading wiring.

An operation method of the pixel circuit illustrated in FIG. 4A will be described below.

First, the case in which the light-emitting/receiving element SA is used as a light-emitting element will be explained.

Figure 4B:
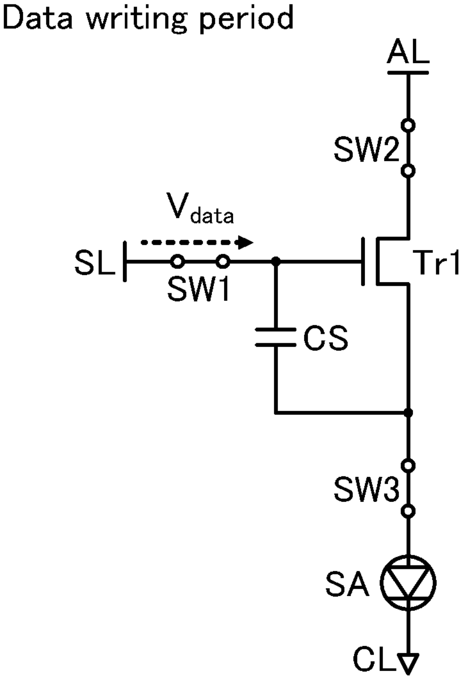
FIG. 4B and FIG. 4C are diagrams illustrating an operation method example of a pixel circuit.

In the data writing period, the switch SW1, the switch SW2, and the switch SW3 are all brought into a conducting state as illustrated in FIG. 4B. Thus, the data potential $V_{data}$ is supplied to the gate of the transistor Tr1 from the wiring SL through the switch SW1.

Figure 4C:
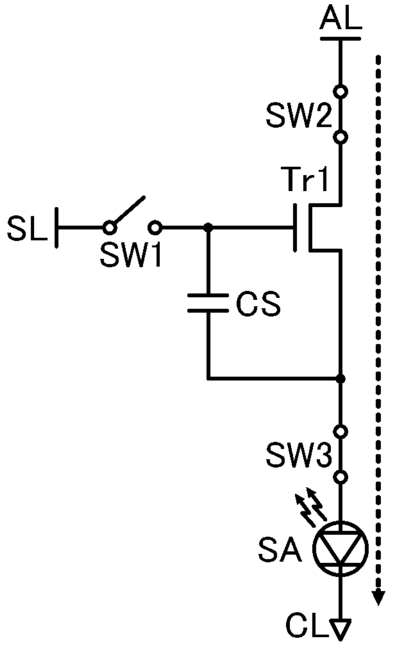

Next, in the holding and light-emitting period, the switch SW1 is brought into a non-conducting state as illustrated in FIG. 4C. Thus, current corresponding to the gate potential of the transistor Tr1 flows through the light-emitting/receiving element SA, and the light-emitting/receiving element SA emits light with luminance corresponding to the amount of the current.

Next, the case in which the light-emitting/receiving element SA is used as a light-receiving element will be explained.

Figure 5A:
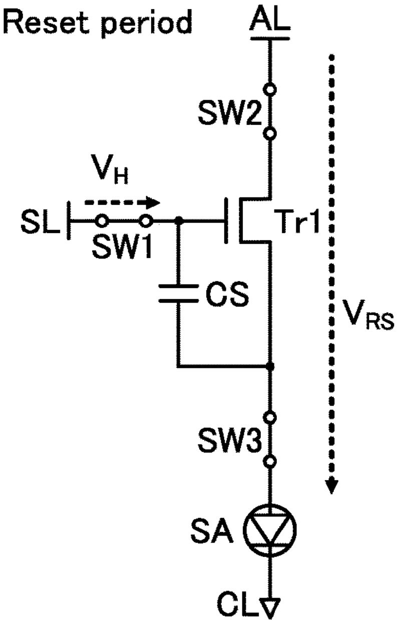
FIG. 5A to FIG. 5E are diagrams illustrating an operation method example of a pixel circuit.

In the reset period, as illustrated in FIG. 5A, the switch SW1, the switch SW2, and the switch SW3 are all brought into a conducting state. A potential $V_H$ is supplied to the gate of the transistor Tr1 from the wiring SL through the switch SW1. Furthermore, the potential $V_{RS}$ is supplied to the wiring AL.

The potential $V_H$ is a potential at which the transistor Tr1 is brought into a conducting state. The potential $V_H$ is, for example, the potential higher than the potential $V_{RS}$ or the potential higher than the potential supplied to the wiring CL (cathode potential).

When the transistor Tr1 is brought into a conducting state, the potential $V_{RS}$ is supplied to the anode of the light-emitting/receiving element SA from the wiring AL through the switch SW2, the transistor Tr1, and the switch SW3.

Figure 5B:
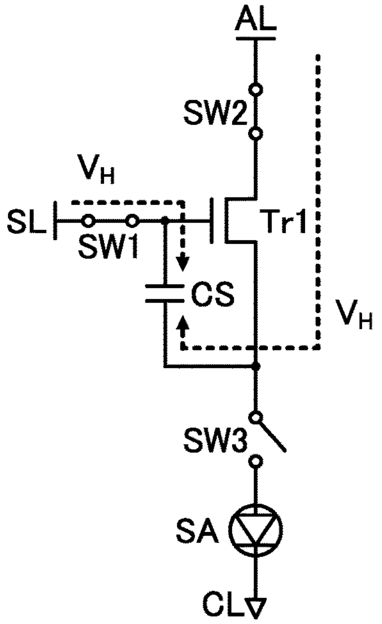

An operation period illustrated in FIG. 5B may be provided after the reset period.

Specifically, in FIG. 5B, after the reset period described above, the switch SW3 is brought into a non-conducting state, and the potential $V_H$ is supplied to each of the wiring SL and the wiring AL. Thus, the same potential $V_H$ is supplied to the pair of electrodes of the capacitor CS and a potential difference is not generated. Similarly, a potential difference is not generated between the source and the gate of the transistor Tr1. The transistor Tr1 is brought into a non-conducting state in the case where the threshold voltage of the transistor Tr1 is positive.

In this manner, the capacitor CS is discharged after the reset period so that electric charge is not accumulated, whereby the noise of image capturing data can be reduced.

Figure 5C:
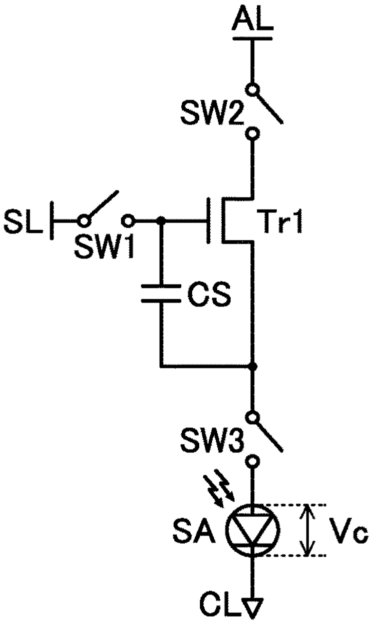

Next, in a light exposure period illustrated in FIG. 5C, the switch SW1, the switch SW2, and the switch SW3 are brought into a non-conducting state.

Figure 5D:
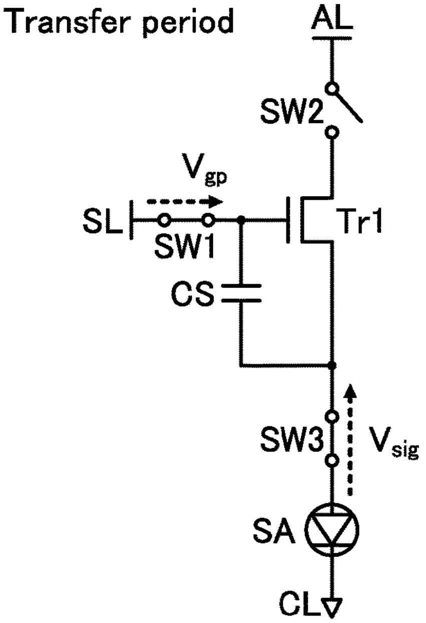

Next, in a transfer period illustrated in FIG. 5D, the switch SW1 and the switch SW3 are brought into a conducting state while the switch SW2 is being in a non-conducting state. Thus, the potential $V_{gp}$ is supplied to the gate of the transistor Tr1 and one electrode of the capacitor CS from the wiring SL through the switch SW1. In addition, the potential of the other of the source and the drain of the transistor Tr1 and the potential of the other electrode of the capacitor CS are each the potential $V_{sig}$ after the transfer as described above.

After the transfer period is completed, the switch SW1 and the switch SW3 may be in a non-conducting state until a reading period starts.

Figure 5E:
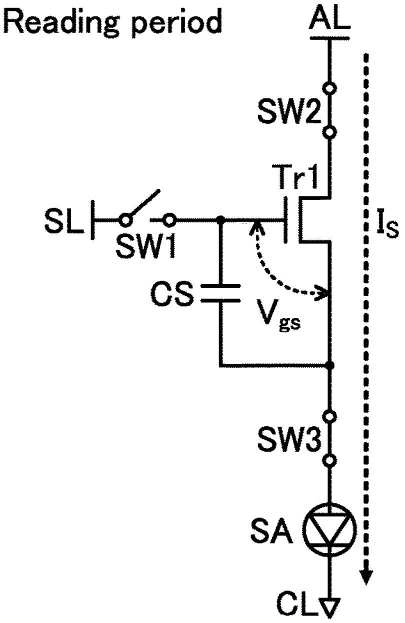

Lastly, in the reading period illustrated in FIG. 5E, the switch SW1 is brought into a non-conducting state, and the switch SW2 and the switch SW3 are brought into a conducting state. Here, the voltage $V_{gs}$ is charged to the capacitor CS; thus, the current Is corresponding to the voltage $V_{gs}$ is supplied to the transistor Tr1. Reading of data of the pixel can be performed by detecting the current Is with a reading circuit connected to the wiring AL.

The above is the description of the modification example.

Structure Example 2

Structure Example 1 of Display Device

More specific structure examples of the display device of one embodiment of the present invention will be described below.

Figure 6:
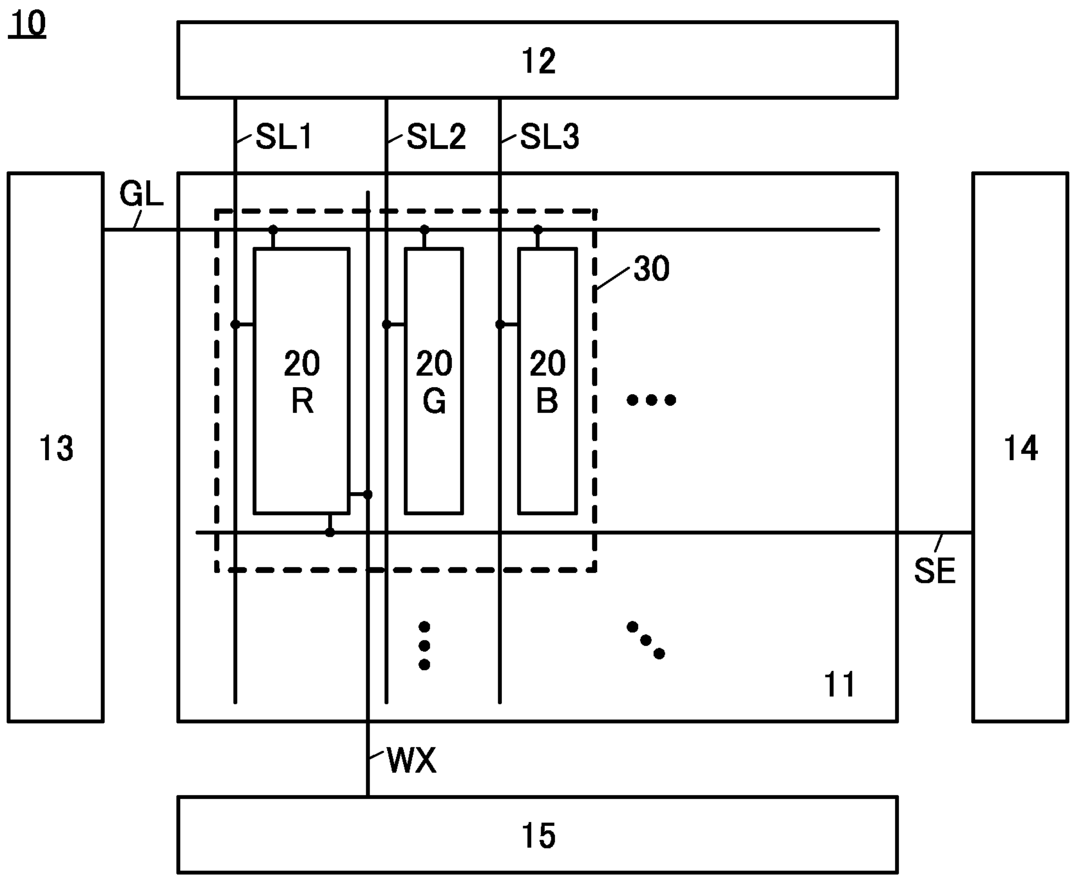
FIG. 6 is a diagram illustrating an example of a display device.

FIG. 6 illustrates a block diagram for describing a structure of a display device 10. The display device 10 includes a display portion 11, a driver circuit portion 12, a driver circuit portion 13, a driver circuit portion 14, a circuit portion 15, and the like.

The display portion 11 includes a plurality of pixels 30 arranged in a matrix. The pixel 30 includes a subpixel 20R, a subpixel 20G, and a subpixel 20B. The subpixel 20R includes a light-emitting/receiving element, and the subpixel 20G and the subpixel 20B each include a light-emitting element.

A wiring SL1, a wiring GL, a wiring SE, the wiring WX, and the like are electrically connected to the subpixel 20R. A wiring SL2, the wiring GL, and the like are electrically connected to the subpixel 20G. A wiring SL3, the wiring GL, and the like are electrically connected to the subpixel 20B.

The wiring SL1, the wiring SL2, and the wiring SL3 are electrically connected to the driver circuit portion 12. The wiring GL is electrically connected to the driver circuit portion 13. The driver circuit portion 12 functions as a source line driver circuit (also referred to as a source driver) and supplies a data signal (data potential) to each of the subpixels through the wiring SL1, the wiring SL2, and the wiring SL3. The driver circuit portion 13 functions as a gate line driver circuit (also referred to as a gate driver) and supplies a selection signal to the wiring GL.

The wiring SE is electrically connected to the driver circuit portion 14. The driver circuit portion 14 has a function of generating a signal to be supplied to the subpixel 20R and outputting the signal to the wiring SE and the like. The driver circuit portion 14 also has a function of generating and outputting a signal to be supplied to a wiring AEN, a wiring REN, and the like that will be described later. Note that the driver circuit portion 13 or the driver circuit portion 12 may have a function of generating the signal to be supplied to the wiring AEN, the wiring REN, and the like.

The wiring WX is electrically connected to the circuit portion 15. The circuit portion 15 has a function of receiving a signal output from the subpixel 20R through the wiring WX and outputting the signal to the outside as image capturing data. The circuit portion 15 functions as a reading circuit. The circuit portion 15 has a function of generating and outputting a signal to be supplied to the wiring WX. Thus, the circuit portion 15 also has a function as a driver circuit. Note that the driver circuit portion 13 or the driver circuit portion 12 may have a function of generating and outputting the signal to be supplied to the wiring WX.

Configuration Example of Pixel

Figure 7:
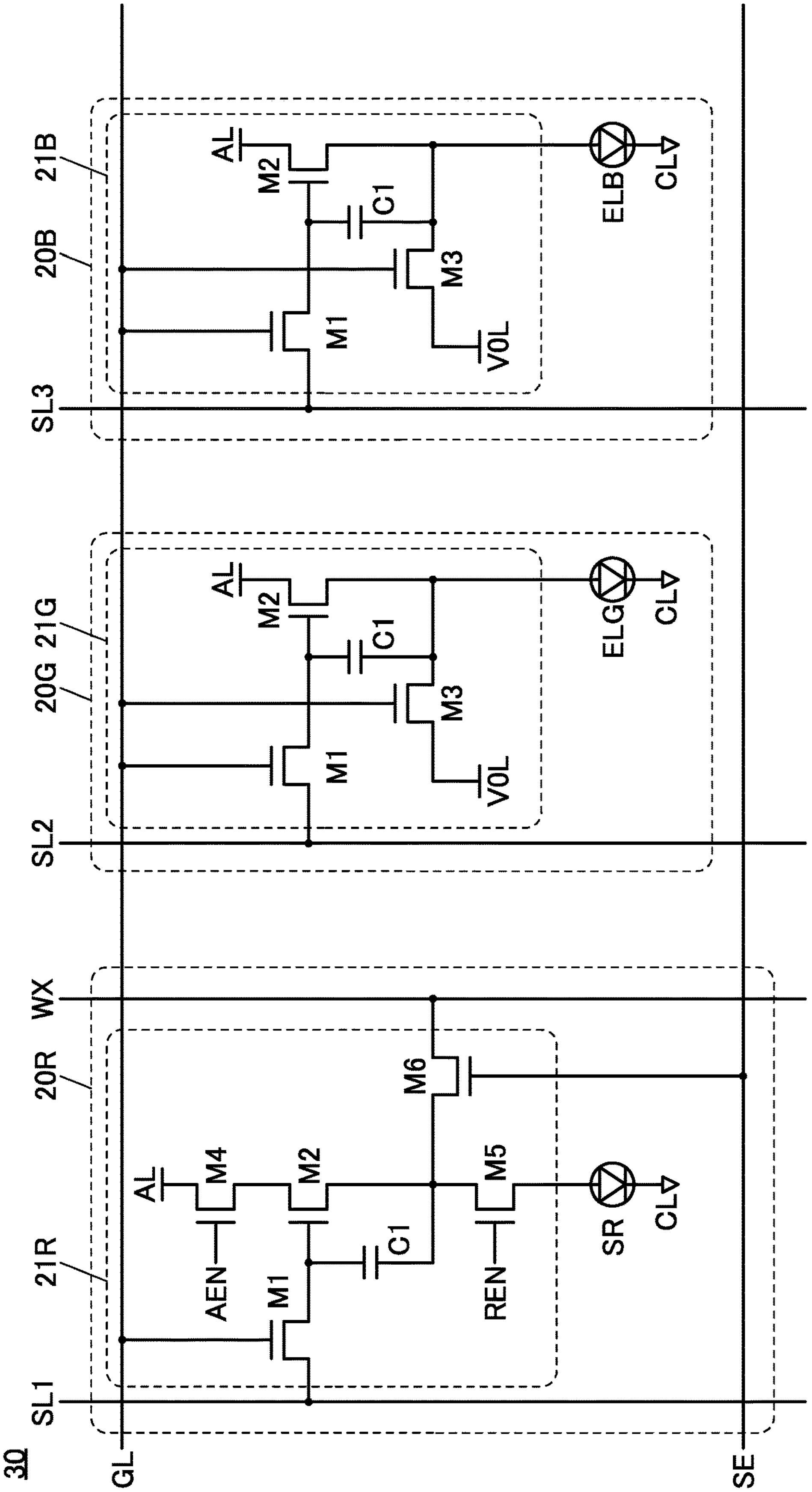
FIG. 7 is a circuit diagram illustrating an example of a pixel.

FIG. 7 illustrates an example of a circuit diagram of the pixel 30. The pixel 30 includes the subpixel 20R, the subpixel 20G, and the subpixel 20B. The subpixel 20R includes a circuit 21R and a light-emitting/receiving element SR. The subpixel 20G includes a circuit 21G and a light-emitting element ELG. The subpixel 20B includes a circuit 21B and a light-emitting element ELB.

The circuit 21R includes a transistor M1, a transistor M2, a transistor M4, a transistor M5, a transistor M6, a capacitor C1, and the like.

The circuit 21R functions as a circuit for controlling the light emission of the light-emitting/receiving element SR when the light-emitting/receiving element SR is used as a light-emitting element. The circuit 21R has a function of controlling current flowing through the light-emitting/receiving element SR in accordance with a data potential supplied from the wiring SL1.

In addition, the circuit 21R functions as a sensor circuit for controlling the operation of the light-emitting/receiving element SR when the light-emitting/receiving element SR is used as a light-receiving element. The circuit 21R has a function of supplying a reverse bias voltage to the light-emitting/receiving element SR, a function of controlling the light exposure period of the light-emitting/receiving element SR, a function of holding a potential based on electric charge transferred from the light-emitting/receiving element SR, a function of outputting a signal based on the potential to the wiring WX, and the like.

The subpixel 20R illustrated in FIG. 7 corresponds to the configuration illustrated in FIG. 1. The transistor M2 corresponds to the transistor Tr1 in FIG. 1. Similarly, the transistor M1, the transistor M4, the transistor M5, and the transistor M6 correspond to the switch SW1, the switch SW2, the switch SW3, and the switch SW4, respectively.

A gate of the transistor M1 is electrically connected to the wiring GL, one of a source and a drain of the transistor M1 is electrically connected to the wiring SL1, and the other of the source and the drain of the transistor M1 is electrically connected to a gate of the transistor M2 and one electrode of the capacitor C1. One of a source and a drain of the transistor M2 is electrically connected to the other of the source and the drain of the transistor M4, and the other of the source and the drain of the transistor M2 is electrically connected to one of a source and a drain of the transistor M5, one of a source and a drain of the transistor M6, and the other electrode of the capacitor C1. A gate of the transistor M4 is electrically connected to the wiring AEN, and one of the source and the drain of the transistor M4 is electrically connected to the wiring AL. A gate of the transistor M5 is electrically connected to the wiring REN, and the other of the source and the drain of the transistor M5 is electrically connected to the anode of the light-emitting/receiving element SR. A gate of the transistor M6 is electrically connected to the wiring SE, and the other of the source and the drain of the transistor M6 is electrically connected to the wiring WX. The cathode of the light-emitting/receiving element SR is electrically connected to the wiring CL.

The data potential $V_{data}$, the potential $V_{off}$, the potential $V_{gp}$, and the like are supplied to the wiring SL1 in different periods. The anode potential is supplied to the wiring AL. The cathode potential is supplied to the wiring CL. In the configuration illustrated in FIG. 7, the anode potential is the potential higher than the cathode potential. The potential $V_0$, the potential $V_{RS}$, and the like are supplied to the wiring WX in different periods. The wiring WX also has a function as a reading line. Signals for controlling conduction and non-conduction of the transistor M4, the transistor M5, the transistor M1, and the transistor M6 are supplied to the wiring AEN, the wiring REN, the wiring GL, and the wiring SE, respectively.

The transistor M6 functions as a selection transistor for reading. Conduction and non-conduction of the transistor M6 are controlled by the signal supplied to the wiring SE. When the transistor M6 and the transistor M4 are brought into a conducting state, electrical continuity is established between the transistor M2 and the wiring WX; thus, current (or voltage) corresponding to the gate-source voltage $V_{gs}$ of the transistor M2 can be output to the wiring WX.

The subpixel 20G includes the circuit 21G and the light-emitting element ELG. The subpixel 20B includes the circuit 21B and the light-emitting element ELB. The circuit 21G and the circuit 21B have similar configurations.

The circuit 21G and the circuit 21B each include the transistor M1, the transistor M2, the transistor M3, and the capacitor C1. A gate of the transistor M3 is electrically connected to the wiring GL, one of a source and a drain of the transistor M3 is electrically connected to the other electrode of the capacitor C1, the other of the source and the drain of the transistor M2, and an anode of the light-emitting element ELG or the light-emitting element ELB, and the other of the source and the drain of the transistor M3 is electrically connected to a wiring V0L.

A constant potential is supplied to the wiring V0L. For example, the same potential as the potential $V_0$ supplied to the wiring WX described above may be supplied to the wiring V0L. In addition, the wiring WX may be used instead of the wiring V0L.

Here, the difference of the number of the transistors between the circuit 21R and the circuit 21G or the circuit 21B is only two. As described above, one embodiment of the present invention can construct a circuit that can make a light-emitting/receiving element serve as both a light-emitting element and a light-receiving element by adding only two transistors to the circuit that drives a light-emitting element. Therefore, an increase of the area of the circuit 21R can be inhibited, and a display device with a high pixel density can be achieved.

Transistors with an extremely low leakage current in a non-conducting state are preferably used as the transistor M1, the transistor M3, the transistor M4, the transistor M5, and the transistor M6 which function as switches. In particular, a transistor using an oxide semiconductor in a semiconductor layer where a channel is formed can be suitably used. It is preferable to use a transistor using the oxide semiconductor as the transistor M2 because all the transistors can be formed through the same manufacturing steps. Note that the transistor M2 may be formed using silicon (including amorphous silicon, polycrystalline silicon, and single crystal silicon) in a semiconductor layer where a channel is formed. Note that without limitation to the above, transistors using silicon can be used as some or all of the transistors. Alternatively, some or all of the transistors may be transistors using an inorganic semiconductor other than silicon, a compound semiconductor, an organic semiconductor, or the like.

Figure 8A:
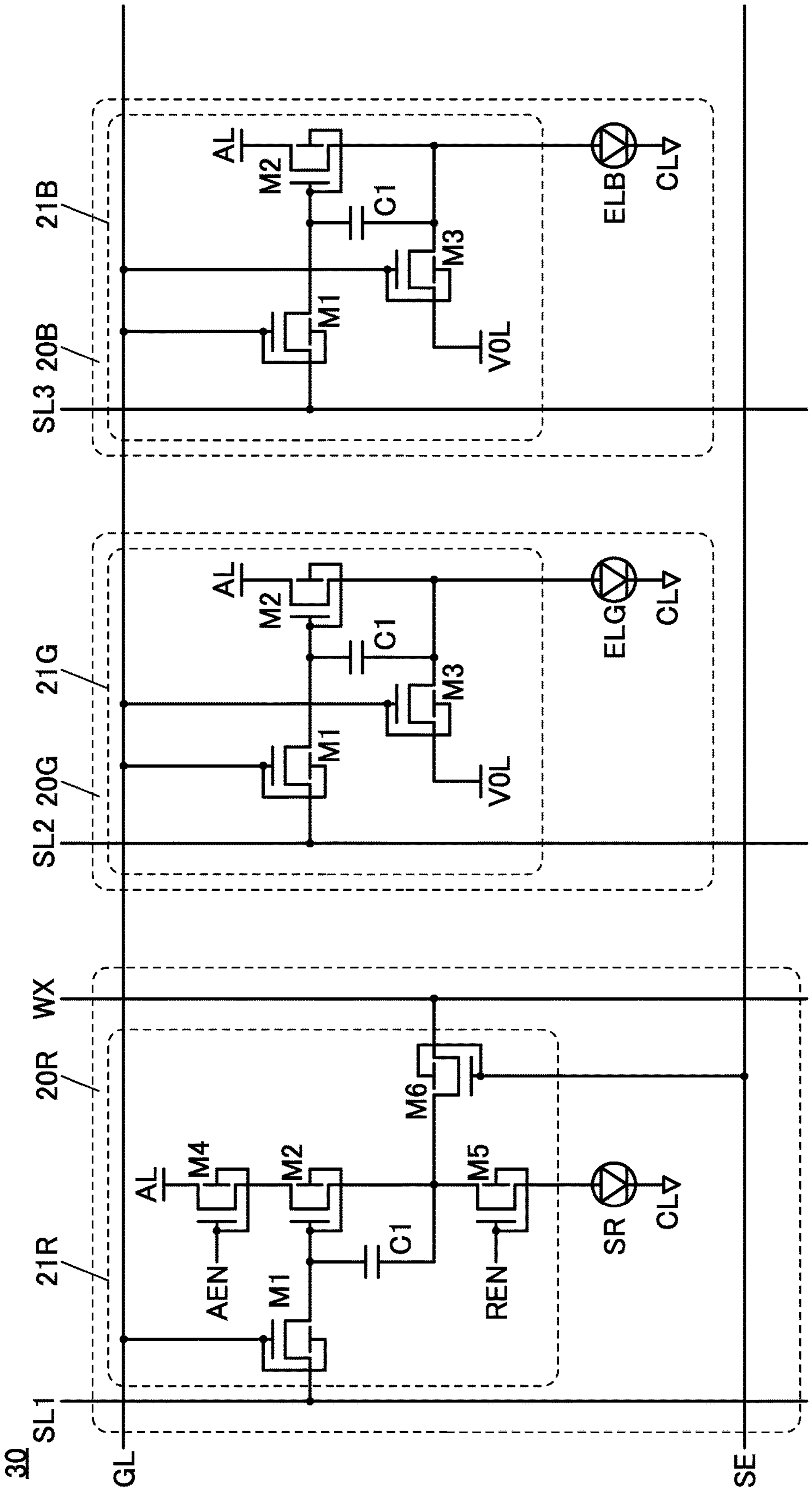
FIG. 8A is a circuit diagram illustrating an example of a pixel.

In addition, as illustrated in FIG. 8A, a configuration may be employed in which a transistor having a back gate is used as each of the transistors. FIG. 8A illustrates a configuration in which a pair of gates are electrically connected to each other.

Figure 8B:
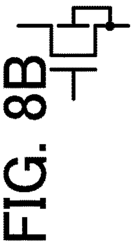
FIG. 8B is a circuit diagram of a transistor.

Note that although FIG. 8A illustrates a configuration where a pair of gates are electrically connected to each other in all the transistors, one embodiment of the present invention is not limited thereto. The pixel 30 may include a transistor in which one of the gates is connected to another wiring. For example, when one of the pair of gates is connected to a wiring supplied with a constant potential, the stability of electrical characteristics can be improved. One of the pair of gates may be connected to a wiring to which the potential for controlling the threshold voltage of the transistor is supplied. Alternatively, a transistor in which one of the pair of gates is connected to one of a source and a drain as illustrated in FIG. 8B may be used. In this case, one of the gates is preferably connected to the source. The transistor illustrated in FIG. 8B can be suitably used as the transistor M2 and the transistor M4 in the pixel 30, for example.

Although the example in which all the transistors each include a back gate is illustrated here, one embodiment of the present invention is not limited thereto, and a transistor that includes a back gate and a transistor that does not include a back gate may be used in combination.

Modification Example

A configuration example of a pixel whose configuration is partly different from that of the above-described configuration example is described below.

Figure 9:
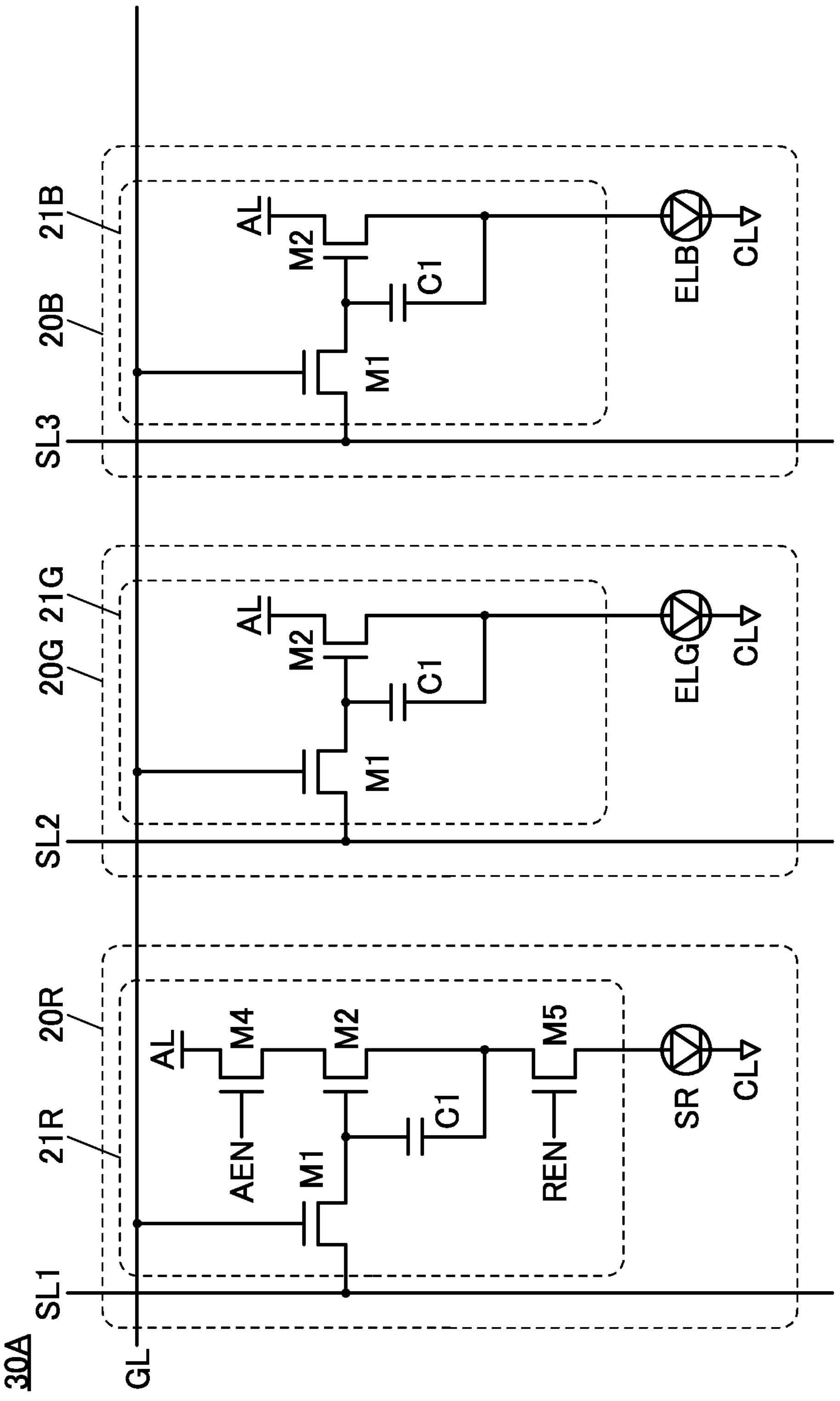
FIG. 9 is a circuit diagram illustrating an example of a pixel.

FIG. 9 illustrates a circuit diagram of a pixel 30A described below. The configuration example illustrated in FIG. 9 is different from that in FIG. 7 in the configurations of the circuit 21R, the circuit 21G, and the circuit 21B.

The circuit 21R is different from the circuit 21R illustrated in FIG. 7 in that the transistor M6, the wiring WX, and the wiring SE are omitted. The circuit 21R corresponds to the configuration illustrated in FIG. 4A above.

The circuit 21G is different from the circuit 21G illustrated in FIG. 7 in that the transistor M3 and the wiring V0L are omitted. Note that the same applies to the circuit 21B.

With such a configuration, the number of transistors and the number of wirings can be further reduced. Specifically, three transistors and four wirings are omitted from the configuration illustrated in FIG. 7. With such a configuration, higher definition and a higher aperture ratio can be achieved.

The above is the description of the modification example.

Structure Example 2 of Display Device

The example where one pixel includes three subpixels is described above; an example where one pixel includes two subpixels will be described below.

Figure 10A:
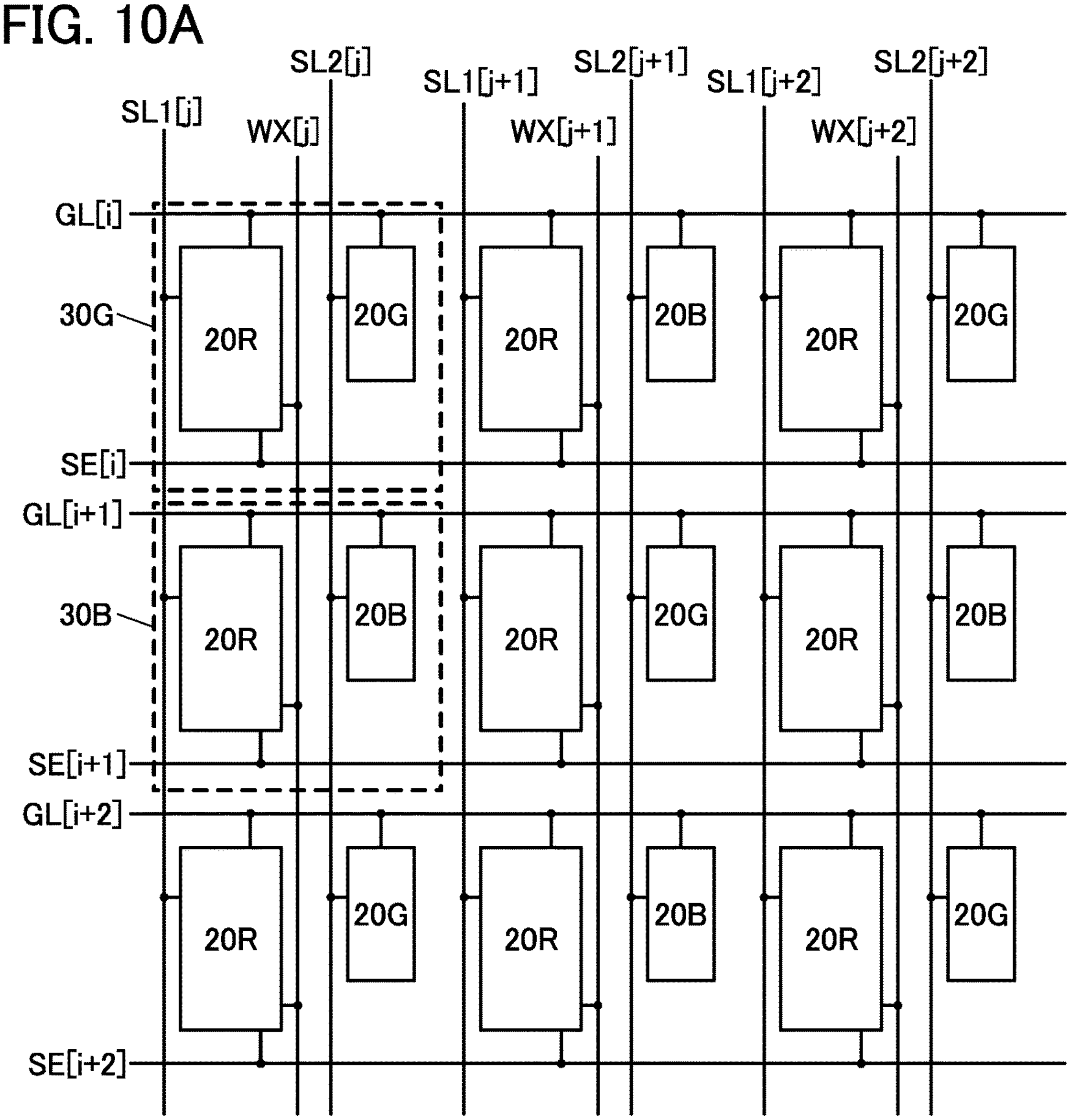
FIG. 10A and FIG. 10B are diagrams illustrating an example of a display device.

FIG. 10A illustrates an example of a method for arranging 3×3 pixels. FIG. 10A illustrates pixels in an i-th row and a j-th column (i and j are each independently an integer greater than or equal to 1) to an (i+2)th row and a (j+2)th column.

In FIG. 10A, pixels 30G and pixels 30B are alternately arranged in the row direction and the column direction. The pixel 30G includes the subpixel 20R and the subpixel 20G. The pixel 30B includes the subpixel 20R and the subpixel 20B.

For example, to the pixel 30G positioned in the i-th row and the j-th column, a wiring GL[i] and a wiring SE[i] that extend in the row direction and a wiring SL1[*j*], a wiring SL2[*j*], and a wiring WX[j] that extend in the column direction are connected.

Figure 10B:
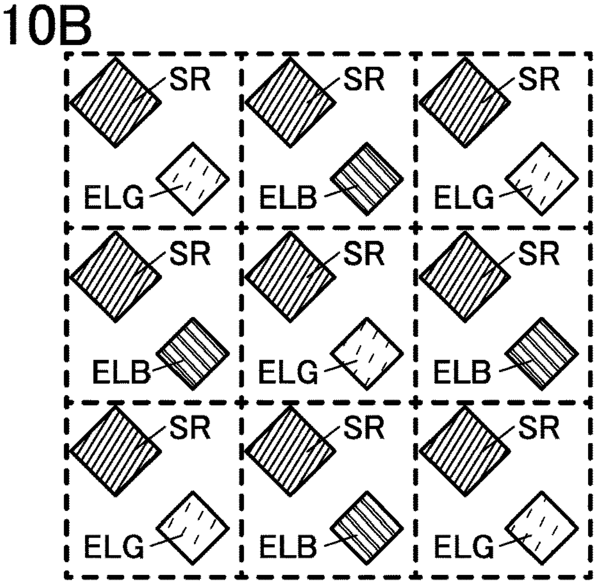

FIG. 10B illustrates an example of a method for arranging the light-emitting/receiving elements SR, the light-emitting elements ELG, and the light-emitting elements ELB. The light-emitting/receiving elements SR are arranged at regular intervals in the row direction and the column direction. The light-emitting elements ELG and the light-emitting elements ELB are alternately arranged in the row direction and the column direction. The light-emitting/receiving element SR, the light-emitting element ELG, and the light-emitting element ELB each have a shape such that a square is tilted at approximately 45 degrees with respect to the arrangement direction. This can increase the distance between adjacent elements; hence, when the light-emitting elements and the light-emitting/receiving elements are separately formed, they can be formed with a high yield.

Driving Method Example

An example of a driving method of the display device is described below.

Figure 11:
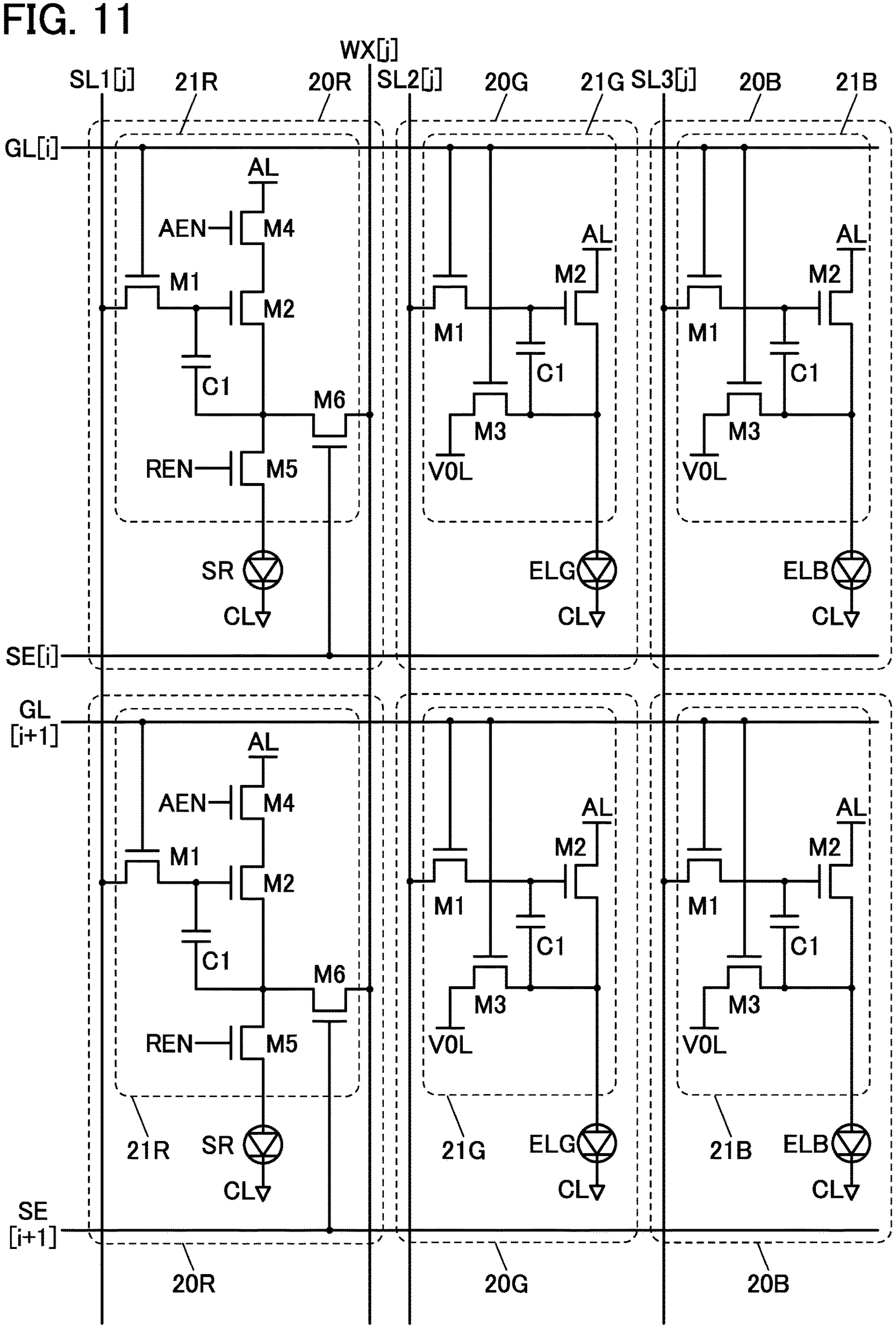
FIG. 11 is a circuit diagram illustrating an example of pixels.

Here, the description will be made using the structure illustrated in FIG. 6, in which one pixel includes three subpixels, as an example. A more specific configuration is illustrated in FIG. 11. FIG. 11 illustrates a circuit diagram of two pixels 30 adjacent to each other in the column direction. Here, a circuit diagram of the pixels 30 in two rows, that is, the i-th row and the j-th column and the (i+1)th row and the j-th column, is illustrated.

Note that in the following description, the display device includes a display portion in which a plurality of pixels are arranged in a matrix of M rows and N columns (M and N are each independently an integer greater than or equal to 2).

Figure 12:
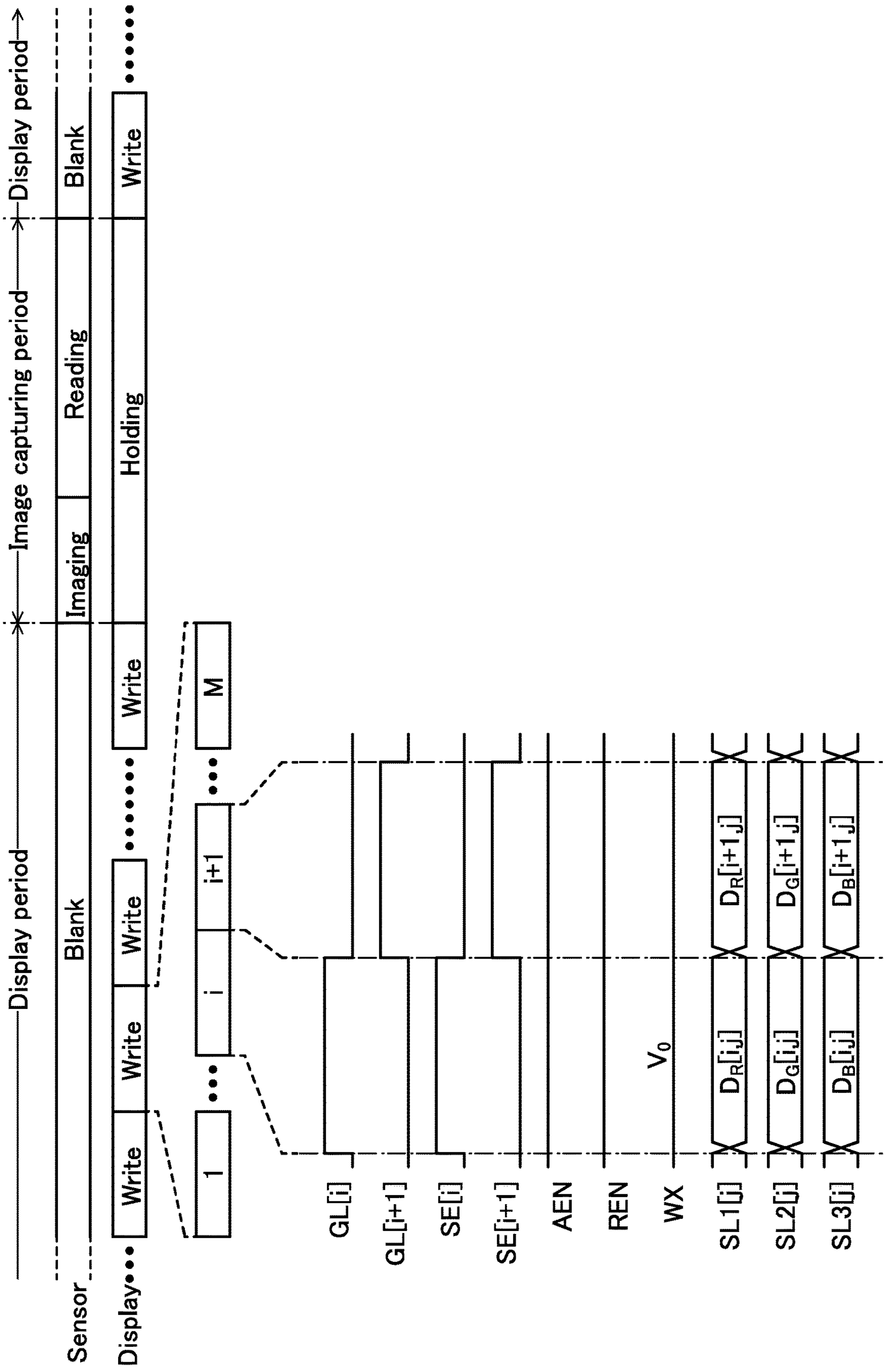
FIG. 12 is a diagram illustrating an example of an operation method of a display device.
Figure 13:
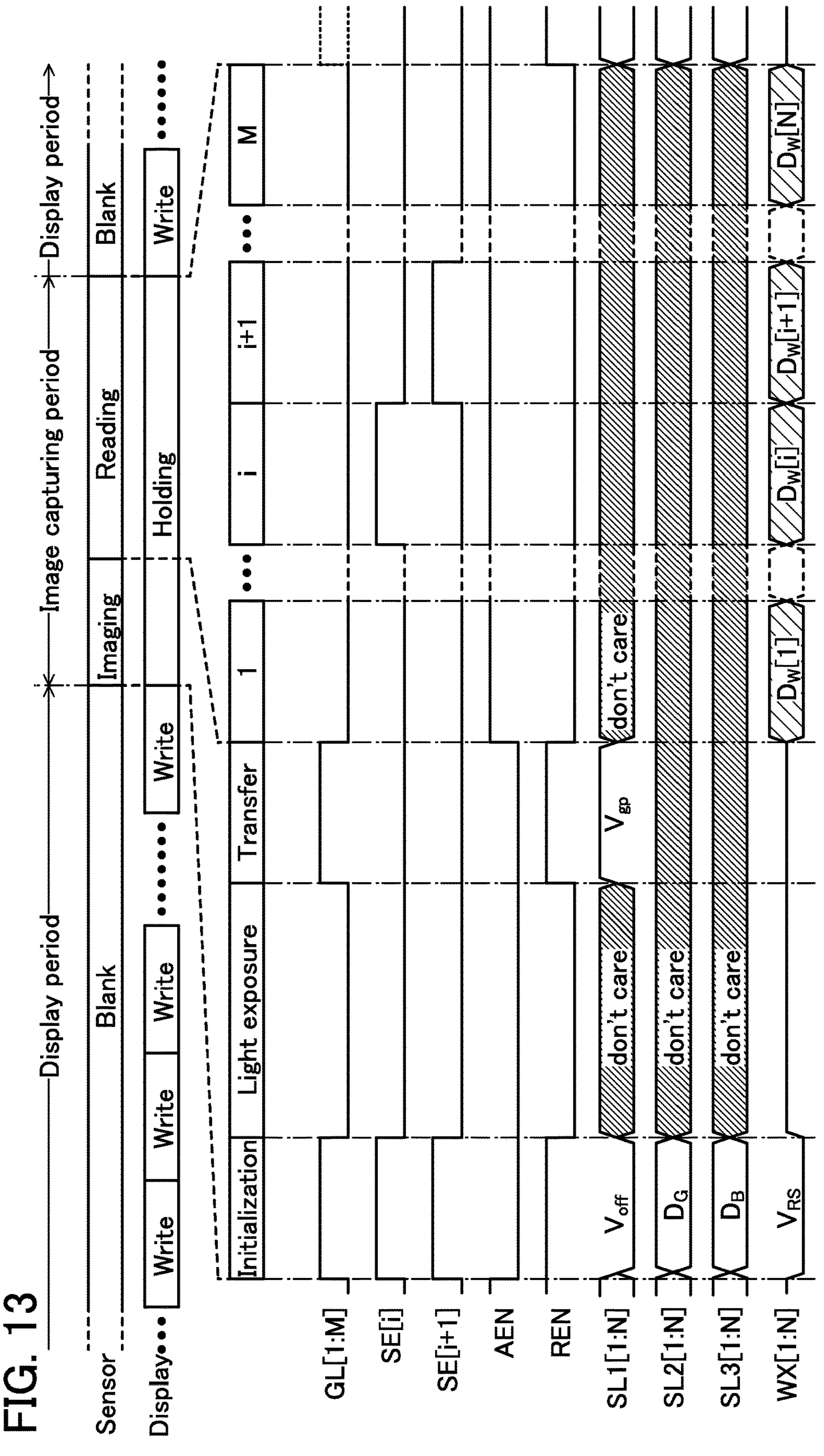
FIG. 13 is a diagram illustrating an example of an operation method of a display device.

FIG. 12 and FIG. 13 schematically illustrate the operation of the display device. The operation of the display device is roughly divided into a period during which an image is displayed using the light-emitting element and the light-emitting/receiving element (a display period) and a period during which image capturing is performed using the light-emitting/receiving element (also referred to as a sensor) (an image capturing period). The display period is a period during which image data is written to the pixels and display based on the image data is performed. The image capturing period is a period during which image capturing with the light-emitting/receiving element and image capturing data reading are performed.

First, the operation in the display period is described with reference to FIG. 12.

In the display period, an operation of writing data to the pixels is performed repeatedly. In the period, no sensor operation is performed (denoted as blank). Note that an image capturing operation can be performed during the display period.

Image data for one frame is written by one writing operation. As illustrated in FIG. 12, data is written to the pixels sequentially from the first column to the M-th column by one writing operation (denoted as write).

FIG. 12 illustrates a timing chart for the operation of writing data in the i-th row and the (i+1)th row. Here, changes in the potentials of the wiring GL[i], a wiring GL[i+1], the wiring SE[i], a wiring SE[i+1], the wiring AEN, the wiring REN, the wiring WX, the wiring SL1[*j*], the wiring SL2[*j*], and a wiring SL3[*j*] are illustrated. FIG. 6 and FIG. 11 can be referred to for connection relations between the wirings and the pixels.

A high-level potential is supplied to the wiring GL[i], the wiring SE[i], the wiring AEN, and the wiring REN in a writing period in the i-th row. In addition, the potential $V_0$ is supplied to the wiring WX. Furthermore, a data potential $D_R$[i,j] is supplied to the wiring SL1[*j*], a data potential $D_G$[i, j] is supplied to the wiring SL2[*j*], and a data potential $D_B$[i, j] is supplied to the wiring SL3[*j*].

Writing in the (i+1)th and subsequent rows can be performed in a manner similar to the above by supplying the high-level potential to the corresponding wiring GL and the corresponding wiring SE and by supplying data potentials to the wiring SL1, the wiring SL2, and the wiring SL3, whereby writing can be performed row by row.

By performing such a writing operation from the first row to the M-th row, data writing for one frame is completed. In the display period, a moving image can be displayed by performing the above operation repeatedly.

Next, the operation in the image capturing period is described with reference to FIG. 13. The case of performing the image capturing operation in a global shutter mode is described here. Note that without limitation to the global shutter mode, a driving method with a rolling shutter mode can also be employed.

The image capturing period is divided into a period during which image capturing is performed simultaneously in all the pixels (denoted as imaging, hereinafter also referred to as an image capturing operation period to be distinguished from the image capturing period) and a period during which image capturing data is read out sequentially (denoted as reading). The image capturing operation period is divided into an initialization period, a light exposure period, and a transfer period. In the reading period, reading of image capturing data is performed row by row from the first row to the M-th row.

FIG. 13 illustrates a timing chart in the image capturing operation period and the reading period. Here, changes in the potentials of wirings GL[1:M], the wiring SE[i], the wiring SE[i+1], the wiring AEN, the wiring REN, wirings SL1[1:N], wirings SL2[1:N], wirings SL3[1:N], and wirings WX[1:N] are illustrated. The wirings GL are collectively denoted as the wirings GL[1:M], and the wirings WX are collectively denoted as the wirings WX[1:N] here. Similarly, the wirings SL1 are collectively denoted, the wirings SL2 are collectively denoted, and the wirings SL3 are collectively denoted.

In the initialization period, a low-level potential is supplied to the wiring AEN. Thus, the transistor M4 is brought into a non-conducting state in all the subpixels 20R. Accordingly, the light-emitting/receiving element SR and the wiring AL are electrically insulated from each other, thereby preventing accidental light emission of the light-emitting/receiving element SR.

In addition, the high-level potential is supplied to all of the wirings GL, all of the wirings SE, and the wiring REN. Thus, the transistor M1, the transistor M5, and the transistor M6 in the subpixels 20R are brought into a conducting state. Then, the potential $V_{off}$ is supplied to all of the wirings SL1 and the potential $V_{RS}$ is supplied to all of the wirings WX. Consequently, the reset operation of all the subpixels 20R is performed.

Here, the data potential $D_G$ and the data potential $D_B$ may be supplied to the wiring SL2 and the wiring SL3, respectively. Thus, one or both of the light-emitting element ELG and the light-emitting element ELB can emit light which can be used as a light source for image capturing.

Next, the low-level potential is supplied to the wiring GL, the wiring SE, and the wiring REN in the light exposure period. Thus, electric charge corresponding to the amount of incident light is accumulated in the light-emitting/receiving element SR.

Next, the high-level potential is supplied to the wiring GL and the wiring REN in the transfer period. Thus, the transistor M1 and the transistor M5 are brought into a conducting state in the subpixel 20R. At this time, electric charge accumulated in the light-emitting/receiving element SR can be transferred to a node to which the source of the transistor M2 is connected. Furthermore, the potential $V_{gp}$ is supplied to a node to which the gate of the transistor M2 is connected from the wiring SL1 through the transistor M1. After that, the low-level potential is supplied to the wiring GL and the wiring REN, so that the potentials of the two nodes described above are held.

Next, the reading of image capturing data is performed row by row. In the reading period, the high-level potential is supplied to the wiring AEN. Furthermore, in the reading period, the high-level potential is sequentially supplied to a wiring SE[1] to a wiring SE[N], whereby data can be read out from all the pixels. For example, for reading in the i-th row, by supplying the high-level potential to the wiring SE[i], data $D_W$[i] in the i-th row is output to the wirings WX[1:N]. Specifically, data $D_W$[i, j] in the i-th row and the j-th column is output to one wiring WX[j].

Here, in the light exposure period and the reading period, the low-level potential is supplied to all the wirings GL and the transistor M1 is in a non-conducting state. Thus, the potential $V_{gp}$ that has been supplied to the gate of the transistor M2 is held. Thus, image capturing with less noise can be performed. Note that the transistor M1 is in a non-conducting state at this time, so that the potential supplied to the wiring SL1 is not limited (denoted as don't care). Similarly, the potentials supplied to the wiring SL2 and the wiring SL3 are not limited.

Although an example in which one piece of data is output through reading from one row is illustrated here, two pieces of data may be output to be used for performing correlated double sampling (CDS). By performing CDS, the influence of variations in electrical characteristics between the pixels can be reduced.

For example, by supplying the high-level potential to the wiring GL and by supplying a predetermined potential from the wiring SL1 in the reading period of one row, second data can be output to the wiring WX.

The above is the description of the driving method example.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, a display device of one embodiment of the present invention will be described.

The display device of one embodiment of the present invention includes a light-emitting element and a light-emitting/receiving element.

The light-emitting/receiving element can be manufactured by combining an organic EL element and an organic photodiode, which are respectively a light-emitting element and a light-receiving element. For example, by adding an active layer of an organic photodiode to a stacked-layer structure of an organic EL element, the light-emitting/receiving element can be manufactured. Furthermore, in the light-emitting/receiving element formed of a combination of an organic EL element and an organic photodiode, concurrently forming layers that can be shared with the light-emitting element can inhibit an increase in the number of deposition steps.

For example, one of a pair of electrodes (a common electrode) can be a layer shared by the light-emitting/receiving element and the light-emitting element. For example, at least one of a hole-injection layer, a hole-transport layer, an electron-transport layer, and an electron-injection layer is preferably a layer shared by the light-emitting/receiving element and the light-emitting element. As another example, the light-emitting/receiving element and the light-emitting element can have the same structure except for the presence or absence of an active layer of the light-receiving element. In other words, the light-emitting/receiving element can be manufactured by only adding the active layer of the light-receiving element to the light-emitting element. When the light-emitting/receiving element and the light-emitting element include common layers in such a manner, the number of deposition steps and the number of masks can be reduced, thereby reducing the number of manufacturing steps and the manufacturing cost of the display device. Furthermore, the display device including the light-emitting/receiving element can be manufactured using an existing manufacturing device and an existing manufacturing method for the display device.

Note that a layer included in the light-emitting/receiving element may have a different function between the case where the light-emitting/receiving element functions as a light-receiving element and the case where the light-emitting/receiving element functions as a light-emitting element. In this specification, the name of a component is based on its function in the case where the light-emitting/receiving element functions as a light-emitting element. For example, a hole-injection layer functions as a hole-injection layer in the case where the light-emitting/receiving element functions as a light-emitting element, and functions as a hole-transport layer in the case where the light-emitting/receiving element functions as a light-receiving element. Similarly, an electron-injection layer functions as an electron-injection layer in the case where the light-emitting/receiving element functions as a light-emitting element, and functions as an electron-transport layer in the case where the light-emitting/receiving element functions as a light-receiving element.

As described above, the display device of this embodiment includes light-emitting/receiving elements and light-emitting elements in its display portion. Specifically, light-emitting/receiving elements and light-emitting elements are arranged in a matrix in the display portion. Accordingly, the display portion has one or both of an image capturing function and a sensing function in addition to a function of displaying an image.

The display portion can be used as an image sensor, a touch sensor, or the like. That is, by detecting light with the display portion, an image can be captured and the approach or touch of an object (e.g., a finger or a stylus) can be detected, for example. Furthermore, in the display device of this embodiment, the light-emitting elements can be used as a light source of the sensor. Accordingly, a light-receiving portion and a light source do not need to be provided separately from the display device; hence, the number of components of an electronic device can be reduced.

In the display device of this embodiment, when an object reflects light emitted from the light-emitting element included in the display portion, the light-emitting/receiving element can detect the reflected light; thus, image capturing, touch (contact or approach) detection, or the like is possible even in a dark place.

The display device of this embodiment has a function of displaying images with the use of a light-emitting element and a light-emitting/receiving element. That is, the light-emitting element and the light-emitting/receiving element function as display elements.

As the light-emitting element, an EL element such as an OLED (Organic Light Emitting Diode) or a QLED (Quantum-dot Light Emitting Diode) is preferably used. Examples of a light-emitting substance contained in the EL element include a substance exhibiting fluorescence (a fluorescent material), a substance exhibiting phosphorescence (a phosphorescent material), an inorganic compound (such as a quantum dot material), and a substance exhibiting thermally activated delayed fluorescence (a thermally activated delayed fluorescence (TADF) material). Alternatively, an LED such as a micro-LED (Light Emitting Diode) can be used as the light-emitting element.

The display device of this embodiment has a function of detecting light with the use of the light-emitting/receiving element. The light-emitting/receiving element can detect light having a shorter wavelength than light emitted from the light-emitting/receiving element itself.

When the light-emitting/receiving element is used as an image sensor, the display device of this embodiment can capture an image using the light-emitting/receiving element. For example, the display device of this embodiment can be used as a scanner.

For example, data on a fingerprint, a palm print, or the like can be obtained with the use of the image sensor. That is, a biological authentication sensor can be incorporated in the display device of this embodiment. When the display device incorporates a biometric authentication sensor, the number of components of an electronic device can be reduced as compared to the case where a biometric authentication sensor is provided separately from the display device; thus, the size and weight of the electronic device can be reduced.

In addition, data on facial expression, eye movement, change of the pupil diameter, or the like of a user can be obtained with the use of the image sensor. By analysis of the data, information on the user's physical and mental state can be obtained. Changing the output contents of one or both of display and sound on the basis of the information allows the user to safely use a device for VR (Virtual Reality), a device for AR (Augmented Reality), or a device for MR (Mixed Reality), for example.

When the light-emitting/receiving element is used as a touch sensor, the display device of this embodiment can detect the approach or touch of an object with the use of the light-emitting/receiving element.

The light-emitting/receiving element functions as a photoelectric conversion element that detects light entering the light-emitting/receiving element and generates electric charge. The amount of generated electric charge depends on the amount of incident light.

The light-emitting/receiving element can be manufactured by adding an active layer of the light-receiving element to the above-described structure of the light-emitting element.

For the light-emitting/receiving element, an active layer of a pn photodiode or a pin photodiode can be used, for example.

It is particularly preferable to use, for the light-emitting/receiving element, an active layer of an organic photodiode including a layer containing an organic compound. An organic photodiode, which is easily made thin, lightweight, and large in area and has a high degree of freedom for shape and design, can be used in a variety of display devices.

FIG. 14A to FIG. 14D illustrate cross-sectional views of display devices of embodiments of the present invention.

Figure 14A:
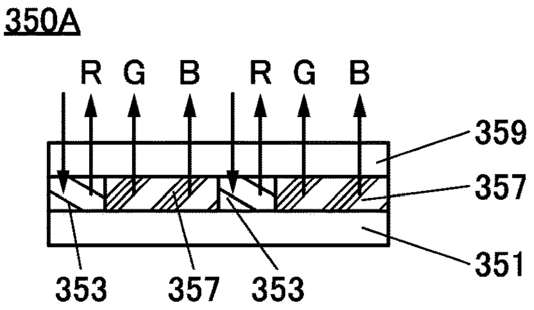
FIG. 14A to FIG. 14D are cross-sectional views illustrating examples of display devices.

A display device 350A illustrated in FIG. 14A includes a layer 353 including a light-emitting/receiving element and a layer 357 including light-emitting elements between a substrate 351 and a substrate 359.

Figure 14B:
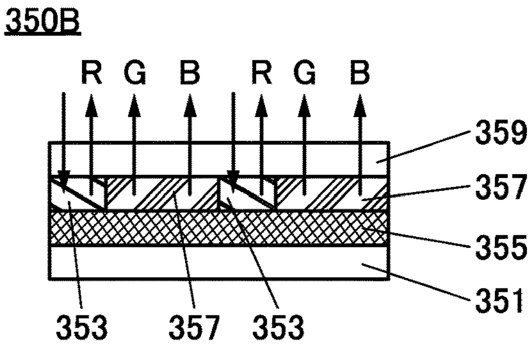

A display device 350B illustrated in FIG. 14B includes the layer 353 including a light-emitting/receiving element, a layer 355 including transistors, and the layer 357 including light-emitting elements between the substrate 351 and the substrate 359.

In the display device 350A and the display device 350B, green (G) light and blue (B) light are emitted from the layer 357 including light-emitting elements, and red (R) light is emitted from the layer 353 including a light-emitting/receiving element. Note that in the display device of one embodiment of the present invention, the color of light emitted from the layer 353 including a light-emitting/receiving element is not limited to red.

The light-emitting/receiving element included in the layer 353 including the light-emitting/receiving element can detect light that enters from the outside of the display device 350A or the display device 350B. The light-emitting/receiving element can detect one or both of green (G) light and blue (B) light, for example.

The display device of one embodiment of the present invention includes a plurality of pixels arranged in a matrix. One pixel includes one or more subpixels. One subpixel includes one light-emitting/receiving element or one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The subpixel of at least one color includes a light-emitting/receiving element. The light-emitting/receiving element may be provided in all the pixels or may be provided in some of the pixels. In addition, one pixel may include a plurality of light-emitting/receiving elements.

The layer 355 including transistors includes a transistor electrically connected to the light-emitting/receiving element and a transistor electrically connected to the light-emitting element, for example. The layer 355 including transistors may also include a wiring, an electrode, a terminal, a capacitor, a resistor, or the like.

Figure 14C:
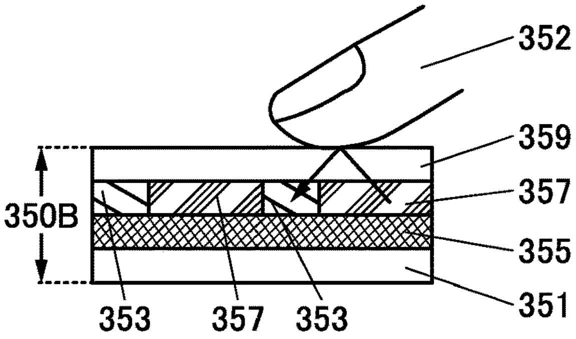
Figure 14D:
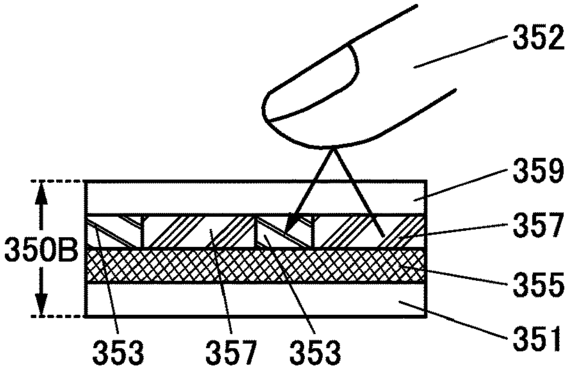

The display device of one embodiment of the present invention may have a function of detecting an object such as a finger that is touching the display device (FIG. 14C). Alternatively, the display device of one embodiment of the present invention may have a function of detecting an object that is approaching (but is not touching) the display device (FIG. 14D). For example, light emitted from the light-emitting element in the layer 357 including the light-emitting elements is reflected by a finger 352 that touches or approaches the display device 350B as illustrated in FIG. 14C and FIG. 14D; then, the light-emitting/receiving element in the layer 353 including the light-emitting/receiving element detects the reflected light. Thus, the touch or approach of the finger 352 on/to the display device 350B can be detected.

[Pixel]

FIG. 14E to FIG. 14G and FIG. 15A to FIG. 15D illustrate examples of pixels. Note that the arrangement of subpixels is not limited to the illustrated order. For example, the positions of a subpixel 311B and a subpixel 311G may be reversed.

Figure 14E:
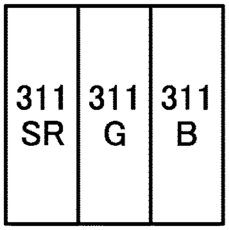
FIG. 14E to FIG. 14G are top views illustrating examples of pixels.

The pixel illustrated in FIG. 14E employs stripe arrangement. The pixel includes a subpixel 311SR that emits red light and has a light-receiving function, the subpixel 311G that emits green light, and the subpixel 311B that emits blue light. By using a light-emitting/receiving element instead of a light-emitting element in the R subpixel, a display device including a pixel composed of three subpixels of R, G, and B can have a light-receiving function in the pixel.

Figure 14F:
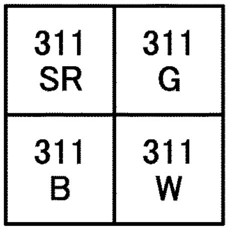

The pixel illustrated in FIG. 14F employs matrix arrangement. The pixel includes the subpixel 311SR that emits red light and has a light-receiving function, the subpixel 311G that emits green light, the subpixel 311B that emits blue light, and a subpixel 311W that emits white light. By using a light-emitting/receiving element instead of a light-emitting element in the R subpixel, a display device including a pixel composed of four subpixels of R, G, B and W can also have a light-receiving function in the pixel.

Figure 14G:
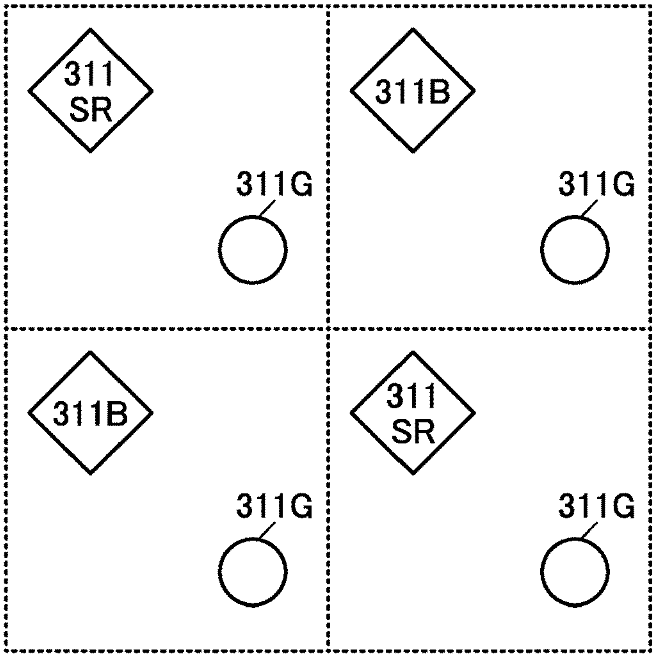

The pixels illustrated in FIG. 14G employ PenTile arrangement. In FIG. 14G, each pixel includes subpixels emitting light of two colors that differ among the pixels. The upper-left pixel and the lower-right pixel illustrated in FIG. 14G each include the subpixel 311SR that emits red light and has a light-receiving function and the subpixel 311G that emits green light. The lower-left pixel and the upper-right pixel illustrated in FIG. 14G each include the subpixel 311G that emits green light and the subpixel 311B that emits blue light. Note that the shape of the subpixels illustrated in FIG. 14G indicates a top-surface shape of the light-emitting element or the light-emitting/receiving element included in the subpixels.

Figure 15A:
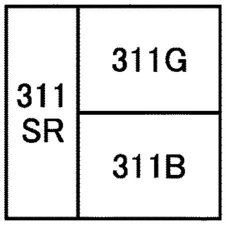
FIG. 15A to FIG. 15D are top views illustrating examples of pixels.

The pixel illustrated in FIG. 15A includes the subpixel 311SR that emits red light and has a light-receiving function, the subpixel 311G that emits green light, and the subpixel 311B that emits blue light. The subpixel 311SR is provided in a column different from a column where the subpixel 311G and the subpixel 311B are positioned. The subpixel 311G and the subpixel 311B are alternately arranged in the same column; one is provided in an odd-numbered row and the other is provided in an even-numbered row. Note that the color of the subpixel positioned in a column different from the column where the subpixels of the other colors are positioned is not limited to red (R) and may alternatively be green (G) or blue (B).

Figure 15B:
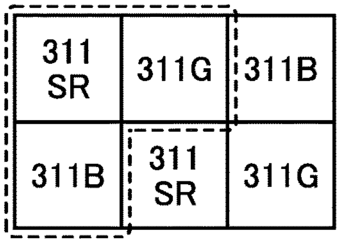

FIG. 15B illustrates two pixels, and one pixel is composed of three subpixels surrounded by dotted lines. The pixel illustrated in FIG. 15B includes the subpixel 311SR that emits red light and has a light-receiving function, the subpixel 311G that emits green light, and the subpixel 311B that emits blue light. In the pixel on the left illustrated in FIG. 15B, the subpixel 311G is positioned in the same row as the subpixel 311SR, and the subpixel 311B is positioned in the same column as the subpixel 311SR. In the pixel on the right illustrated in FIG. 15B, the subpixel 311G is positioned in the same row as the subpixel 311SR, and the subpixel 311B is positioned in the same column as the subpixel 311G. In the pixel layout illustrated in FIG. 15B, the subpixel 311SR, the subpixel 311G, and the subpixel 311B are repeatedly arranged in both the odd-numbered row and the even-numbered row. In addition, subpixels of different colors are arranged in the odd-numbered row and the even-numbered row in every column.

Figure 15C:
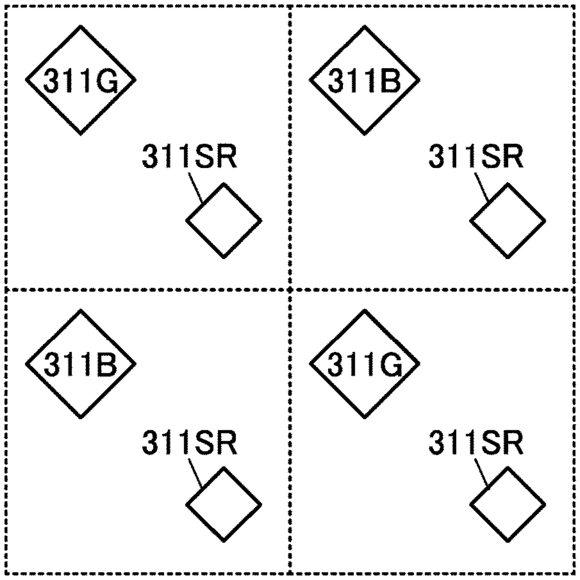

FIG. 15C is a modification example of the pixel arrangement illustrated in FIG. 14G. The upper-left pixel and the lower-right pixel illustrated in FIG. 15C each include the subpixel 311SR that emits red light and has a light-receiving function and the subpixel 311G that emits green light. The lower-left pixel and the upper-right pixel illustrated in FIG. 15C each include the subpixel 311SR that emits red light and has a light-receiving function and the subpixel 311B that emits blue light.

In FIG. 14G, the subpixel 311G that emits green light is provided in each pixel. Meanwhile, in FIG. 15C, the subpixel 311SR that emits red light and has a light-receiving function is provided in each pixel. The structure illustrated in FIG. 15C achieves higher-definition image capturing than the structure illustrated in FIG. 14G because a subpixel having a light-receiving function is provided in each pixel. Thus, the accuracy of biometric authentication can be increased, for example.

The top-surface shape of the light-emitting elements and the light-emitting/receiving elements is not particularly limited and can be a circular shape, an elliptical shape, a polygonal shape, a polygonal shape with rounded corners, or the like. The top-surface shape of the light-emitting elements included in the subpixels 311G is circular in the example in FIG. 14G and square in the example in FIG. 15C. The top-surface shape of the light-emitting elements and the light-emitting/receiving elements may vary depending on the color thereof, or the light-emitting elements and the light-emitting/receiving elements of some colors or every color may have the same top-surface shape.

The aperture ratio of subpixels may vary depending on the color thereof, or may be the same among the subpixels of some colors or all colors. For example, the aperture ratio of a subpixel provided in each pixel (the subpixel 311G in FIG. 14G, and the subpixel 311SR in FIG. 15C) may be made lower than that of a subpixel of another color.

Figure 15D:
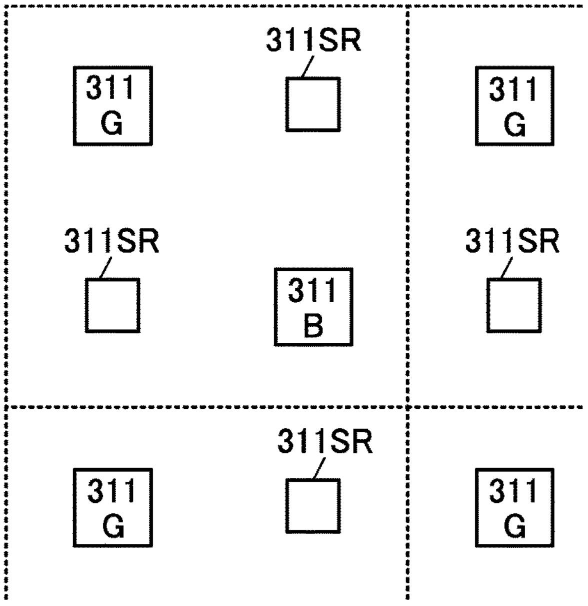

FIG. 15D is a modification example of the pixel arrangement illustrated in FIG. 15C. Specifically, the structure of FIG. 15D is obtained by rotating the structure of FIG. 15C by 45°. Although one pixel is regarded as being composed of two subpixels in FIG. 15C, one pixel can be regarded as being composed of four subpixels as illustrated in FIG. 15D.

In the description with reference to FIG. 15D, one pixel is regarded as being composed of four subpixels surrounded by dotted lines. One pixel includes two subpixels 311SR, one subpixel 311G, and one subpixel 311B. In this manner, one pixel including a plurality of subpixels having a light-receiving function allows high-definition image capturing. Accordingly, the accuracy of biometric authentication can be increased. For example, the definition of image capturing can be the square root of 2 times the definition of display.

A display device which employs the structure illustrated in FIG. 15C or FIG. 15D includes p first light-emitting elements (p is an integer greater than or equal to 2), q second light-emitting elements (q is an integer greater than or equal to 2), and r light-emitting/receiving elements (r is an integer greater than p and greater than q). As for p and r, r=2p is satisfied. As for p, q, and r, r=p+q is satisfied. Either the first light-emitting elements or the second light-emitting elements emit green light, and the other light-emitting elements emit blue light. The light-emitting/receiving elements emit red light and have a light-receiving function.

In the case where touch detection is performed with the light-emitting/receiving elements, for example, it is preferable that light emitted from a light source be hard for a user to recognize. Since blue light has lower visibility than green light, light-emitting elements that emit blue light are preferably used as a light source. Accordingly, the light-emitting/receiving elements preferably have a function of receiving blue light and converting the light into an electric signal.

As described above, the display device of one embodiment of the present invention can employ pixels with a variety of arrangements.

The pixel arrangement in the display device of this embodiment need not be changed when a light-receiving function is incorporated into pixels; thus, the display portion can be provided with one or both of an image capturing function and a sensing function without reductions in the aperture ratio and definition.

[Light-Emitting/Receiving Element]

FIG. 16A to FIG. 16E illustrate examples of stacked-layer structures of light-emitting/receiving elements.

The light-emitting/receiving element includes at least an active layer and a light-emitting layer between a pair of electrodes.

In addition to the active layer and the light-emitting layer, the light-emitting/receiving element may further include a layer containing a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with high electron- and hole-transport properties), or the like.

Figure 16A:
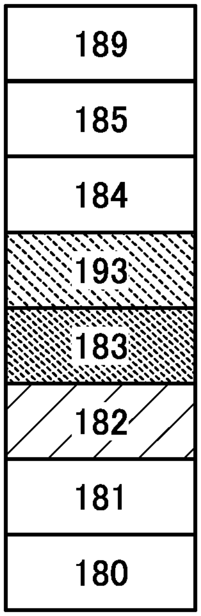
FIG. 16A to FIG. 16E are cross-sectional views illustrating examples of light-emitting/receiving elements.
Figure 16B:
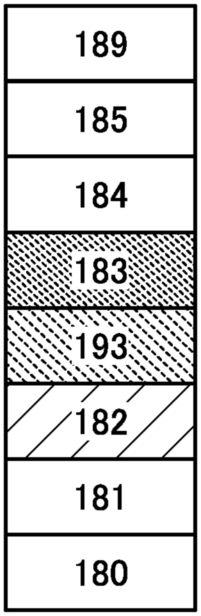
Figure 16C:
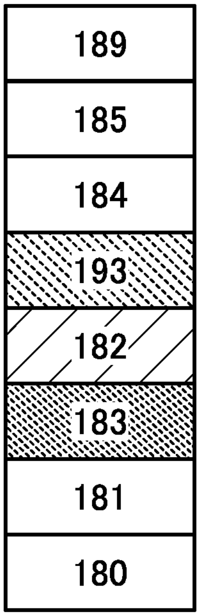

The light-emitting/receiving elements illustrated in FIG. 16A to FIG. 16C each include a first electrode 180, a hole-injection layer 181, a hole-transport layer 182, an active layer 183, a light-emitting layer 193, an electron-transport layer 184, an electron-injection layer 185, and a second electrode 189.

Note that each of the light-emitting/receiving elements illustrated in FIG. 16A to FIG. 16C can be regarded as having a structure where the active layer 183 is added to the light-emitting element. Therefore, the light-emitting/receiving element can be formed concurrently with the light-emitting element only by adding a step of forming the active layer 183 in the manufacturing process of the light-emitting element. The light-emitting element and the light-emitting/receiving element can be formed over one substrate. Thus, the display portion can be provided with one or both of an image capturing function and a sensing function without a significant increase in the number of manufacturing steps.

The stacking order of the light-emitting layer 193 and the active layer 183 is not limited. FIG. 16A illustrates an example in which the active layer 183 is provided over the hole-transport layer 182 and the light-emitting layer 193 is provided over the active layer 183. FIG. 16B illustrates an example in which the light-emitting layer 193 is provided over the hole-transport layer 182 and the active layer 183 is provided over the light-emitting layer 193. The active layer 183 and the light-emitting layer 193 may be in contact with each other as illustrated in FIG. 16A and FIG. 16B.

As illustrated in FIG. 16C, a buffer layer is preferably provided between the active layer 183 and the light-emitting layer 193. As the buffer layer, at least one layer of a hole-injection layer, a hole-transport layer, an electron-transport layer, an electron-injection layer, a hole-blocking layer, an electron-blocking layer, and the like can be used. FIG. 16C illustrates an example in which the hole-transport layer 182 is used as the buffer layer.

The buffer layer provided between the active layer 183 and the light-emitting layer 193 can inhibit transfer of excitation energy from the light-emitting layer 193 to the active layer 183. Furthermore, the buffer layer can also be used to adjust the optical path length (cavity length) of the microcavity structure. Thus, high emission efficiency can be obtained from the light-emitting/receiving element including the buffer layer between the active layer 183 and the light-emitting layer 193.

Figure 16D:
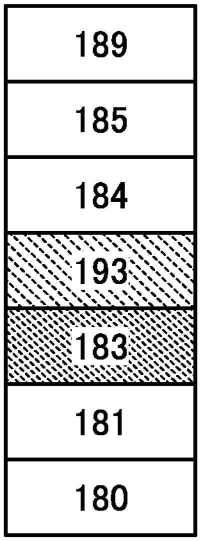

The light-emitting/receiving element illustrated in FIG. 16D is different from the light-emitting/receiving elements illustrated in FIG. 16A and FIG. 16C in not including the hole-transport layer 182. The light-emitting/receiving element may exclude at least one of the hole-injection layer 181, the hole-transport layer 182, the electron-transport layer 184, and the electron-injection layer 185. Furthermore, the light-emitting/receiving element may include another functional layer such as a hole-blocking layer or an electron-blocking layer.

Figure 16E:
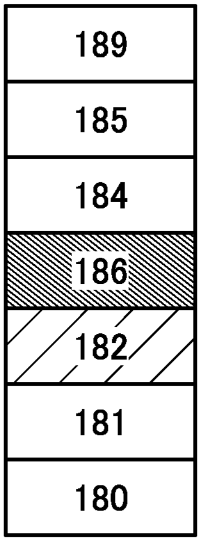

The light-emitting/receiving element illustrated in FIG. 16E is different from the light-emitting/receiving elements illustrated in FIG. 16A to FIG. 16C in including a layer 186 serving as both a light-emitting layer and an active layer instead of including the active layer 183 and the light-emitting layer 193.

As the layer 186 serving as both a light-emitting layer and an active layer, it is possible to use, for example, a layer containing three materials which are an n-type semiconductor that can be used for the active layer 183, a p-type semiconductor that can be used for the active layer 183, and a light-emitting substance that can be used for the light-emitting layer 193.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting/receiving element, a conductive film that transmits visible light is used as the electrode through which light is extracted. A conductive film that reflects visible light is preferably used as the electrode through which light is not extracted.

When the light-emitting/receiving element is driven as a light-emitting element, the hole-injection layer serves as a layer that injects holes from the anode to the hole-transport layer. The hole-injection layer is a layer containing a material with a high hole-injection property. As the material with a high hole-injection property, a composite material containing a hole-transport material and an acceptor material (an electron-accepting material), an aromatic amine compound (a compound having an aromatic amine skeleton), or the like can be used.

When the light-emitting/receiving element is driven as a light-emitting element, the hole-transport layer serves as a layer that transports holes injected from the anode by the hole-injection layer, to the light-emitting layer. When the light-emitting/receiving element is driven as a light-receiving element, the hole-transport layer serves as a layer that transports holes generated in the active layer on the basis of incident light, to the anode. The hole-transport layer is a layer containing a hole-transport material. As the hole-transport material, a substance having a hole mobility of greater than or equal to $1\times10^{-6}$ $cm^2/Vs$ is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine compound, are preferred.

When the light-emitting/receiving element is driven as a light-emitting element, the electron-transport layer serves as a layer that transports electrons injected from the cathode by the electron-injection layer, to the light-emitting layer. When the light-emitting/receiving element is driven as a light-receiving element, the electron-transport layer serves as a layer that transports electrons generated in the active layer on the basis of incident light, to the cathode. The electron-transport layer is a layer containing an electron-transport material. As the electron-transport material, a substance with an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

When the light-emitting/receiving element is driven as a light-emitting element, the electron-injection layer serves as a layer that injects electrons from the cathode to the electron-transport layer. The electron-injection layer is a layer containing a material with a high electron-injection property. As the material with a high electron-injection property, an alkali metal, an alkaline earth metal, or a compound thereof can be used. As the material with a high electron-injection property, a composite material containing the electron-transport material and a donor material (electron-donating material) can also be used.

The light-emitting layer 193 is a layer that contains a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 193 may contain one or more kinds of organic compounds (e.g., a host material and an assist material) in addition to the light-emitting substance (a guest material). As the one or more kinds of organic compounds, one or both of the hole-transport material and the electron-transport material can be used. As the one or more kinds of organic compounds, a bipolar material or a TADF material may be used.

The light-emitting layer 193 preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (the highest occupied molecular orbital level) of the hole-transport material is preferably higher than or equal to the HOMO level of the electron-transport material. The LUMO level (the lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

The formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 183 contains a semiconductor. Examples of the semiconductor include an inorganic semiconductor such as silicon and an organic semiconductor including an organic compound. This embodiment illustrates an example in which an organic semiconductor is used as the semiconductor included in the active layer. The use of an organic semiconductor is preferable because the light-emitting layer 193 and the active layer 183 can be formed by the same method (e.g., a vacuum evaporation method) and thus the same manufacturing device can be used.

Examples of an n-type semiconductor material contained in the active layer 183 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. However, since fullerene has a spherical shape, fullerene has a high-electron-accepting property even when π-electrons widely spread. The high electron-accepting property efficiently causes rapid electric charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of the p-type semiconductor material contained in the active layer 183 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of the p-type semiconductor material include a carbazole derivative, a thiophene derivative, a furan derivative, and an aromatic amine compound. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 183 is preferably formed by co-evaporation of an n-type semiconductor and a p-type semiconductor.

The layer 186 serving as both a light-emitting layer and an active layer is preferably formed using the above-described light-emitting substance, n-type semiconductor, and p-type semiconductor.

The hole-injection layer 181, the hole-transport layer 182, the active layer 183, the light-emitting layer 193, the electron-transport layer 184, the electron-injection layer 185, and the layer 186 serving as both a light-emitting layer and an active layer may be formed using either a low-molecular compound or a high-molecular compound and may contain an inorganic compound. Each of the layers can be formed by an evaporation method (including a vacuum evaporation method), a transfer method, a printing method, an inkjet method, a coating method, or the like.

Detailed structures of the light-emitting/receiving element and the light-emitting elements included in the display device of one embodiment of the present invention will be described below with reference to FIG. 17 to FIG. 19.

The display device of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

FIG. 17 to FIG. 19 illustrate top-emission display devices as examples.

Structure Example 1

Figure 17A:
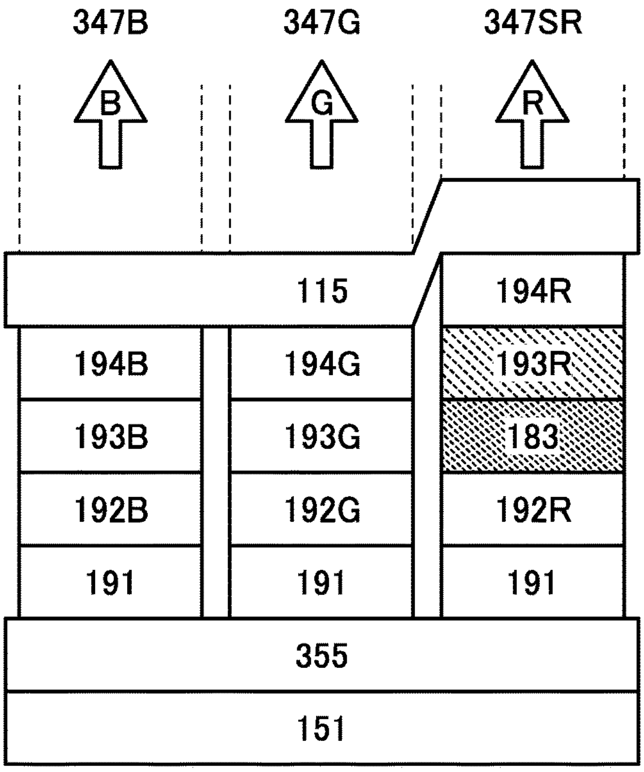
FIG. 17A and FIG. 17B are cross-sectional views illustrating an example of a display device.
Figure 17B:
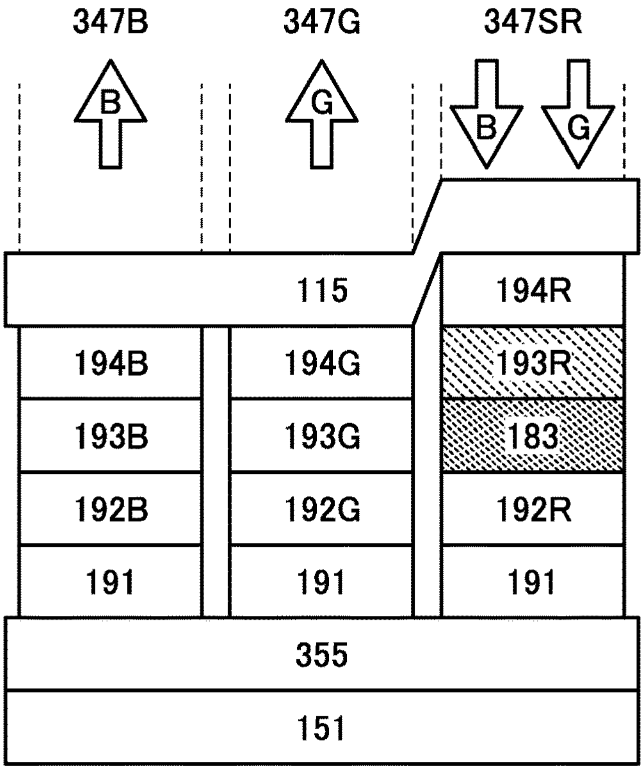

The display devices illustrated in FIG. 17A and FIG. 17B include a light-emitting element 347B that emits blue (B) light, a light-emitting element 347G that emits green (G) light, and a light-emitting/receiving element 347SR that emits red (R) light and has a light-receiving function over a substrate 151 with the layer 355 including transistors therebetween.

FIG. 17A illustrates the case where the light-emitting/receiving element 347SR functions as a light-emitting element. FIG. 17A illustrates an example in which the light-emitting element 347B emits blue light, the light-emitting element 347G emits green light, and the light-emitting/receiving element 347SR emits red light.

FIG. 17B illustrates the case where the light-emitting/receiving element 347SR functions as a light-receiving element. FIG. 17B illustrates an example in which the light-emitting/receiving element 347SR detects blue light emitted from the light-emitting element 347B and green light emitted from the light-emitting element 347G.

The light-emitting element 347B, the light-emitting element 347G, and the light-emitting/receiving element 347SR each include a pixel electrode 191 and a common electrode 115. In this embodiment, the case where the pixel electrode 191 functions as an anode and the common electrode 115 functions as a cathode is described as an example.

In the description in this embodiment, also in the light-emitting/receiving element 347SR, the pixel electrode 191 functions as an anode and the common electrode 115 functions as a cathode as in the light-emitting elements. In other words, the light-emitting/receiving element 347SR is driven by application of reverse bias between the pixel electrode 191 and the common electrode 115, so that light incident on the light-emitting/receiving element 347SR can be detected.

The common electrode 115 is shared by the light-emitting element 347B, the light-emitting element 347G, and the light-emitting/receiving element 347SR.

The material, thickness, and the like of the pair of electrodes can be the same in the light-emitting element 347B, the light-emitting element 347G, and the light-emitting/receiving element 347SR. Accordingly, the manufacturing cost of the display device can be reduced, and the manufacturing process of the display device can be simplified.

The structures of the display devices illustrated in FIG. 17A and FIG. 17B will be specifically described.

The light-emitting element 347B includes a buffer layer 192B, a light-emitting layer 193B, and a buffer layer 194B in this order over the pixel electrode 191. The light-emitting layer 193B contains a light-emitting substance that emits blue light. The light-emitting element 347B has a function of emitting blue light.

The light-emitting element 347G includes a buffer layer 192G, a light-emitting layer 193G, and a buffer layer 194G in this order over the pixel electrode 191. The light-emitting layer 193G contains a light-emitting substance that emits green light. The light-emitting element 347G has a function of emitting green light.

The light-emitting/receiving element 347SR includes a buffer layer 192R, the active layer 183, a light-emitting layer 193R, and a buffer layer 194R in this order over the pixel electrode 191. The light-emitting layer 193R contains a light-emitting substance that emits red light. The active layer 183 contains an organic compound that absorbs light having a shorter wavelength than red light (e.g., one or both of green light and blue light). Note that an organic compound that absorbs ultraviolet light as well as visible light may be used for the active layer 183. The light-emitting/receiving element 347SR has a function of emitting red light. The light-emitting/receiving element 347SR has a function of detecting light emitted from at least one of the light-emitting element 347G and the light-emitting element 347B and preferably has a function of detecting light emitted from both of them.

The active layer 183 preferably contains an organic compound that does not easily absorb red light and absorbs light having a shorter wavelength than red light. Thus, the light-emitting/receiving element 347SR can have a function of efficiently emitting red light and a function of accurately detecting light having a shorter wavelength than red light.

The pixel electrode 191, the buffer layer 192R, the buffer layer 192G, the buffer layer 192B, the active layer 183, the light-emitting layer 193R, the light-emitting layer 193G, the light-emitting layer 193B, the buffer layer 194R, the buffer layer 194G, the buffer layer 194B, and the common electrode 115 may each have a single-layer structure or a stacked-layer structure.

In the display devices illustrated in FIG. 17A and FIG. 17B, the buffer layer, the active layer, and the light-emitting layer are formed in each element individually.

The buffer layers 192R, 192G, and 192B (hereinafter collectively referred to as the buffer layers 192) can each include one or both of a hole-injection layer and a hole-transport layer. Furthermore, the buffer layers 192R, 192G, and 192B may each include an electron-blocking layer. The buffer layers 194B, 194G, and 194R (hereinafter collectively referred to as the buffer layers 194) can each include one or both of an electron-injection layer and an electron-transport layer. Furthermore, the buffer layers 194R, 194G, and 194B may each include a hole-blocking layer. Note that the above description of the layers included in the light-emitting/receiving element can be referred to for materials and the like of the layers included in the light-emitting elements.

Structure Example 2

Figure 18A:
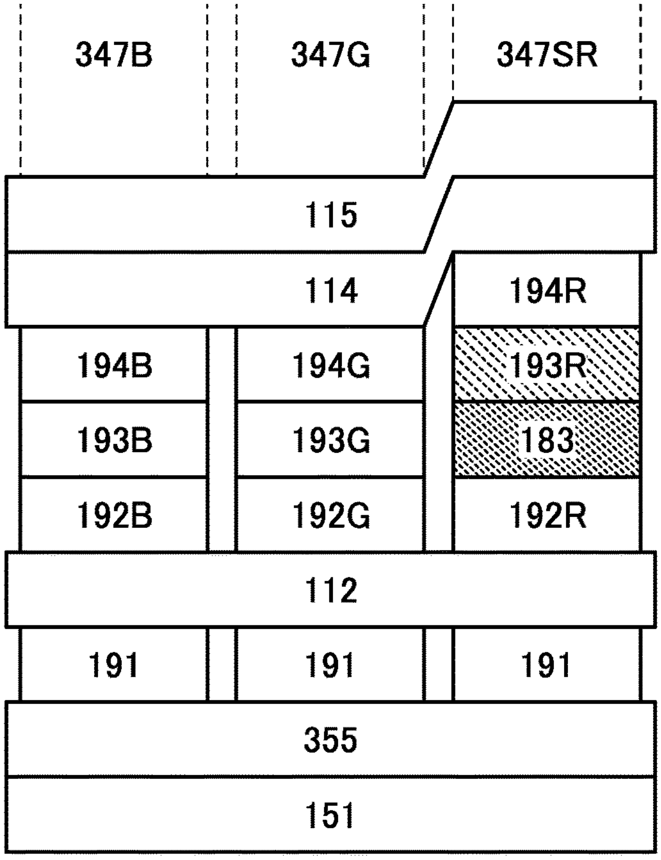
FIG. 18A and FIG. 18B are cross-sectional views illustrating examples of a display device.
Figure 18B:
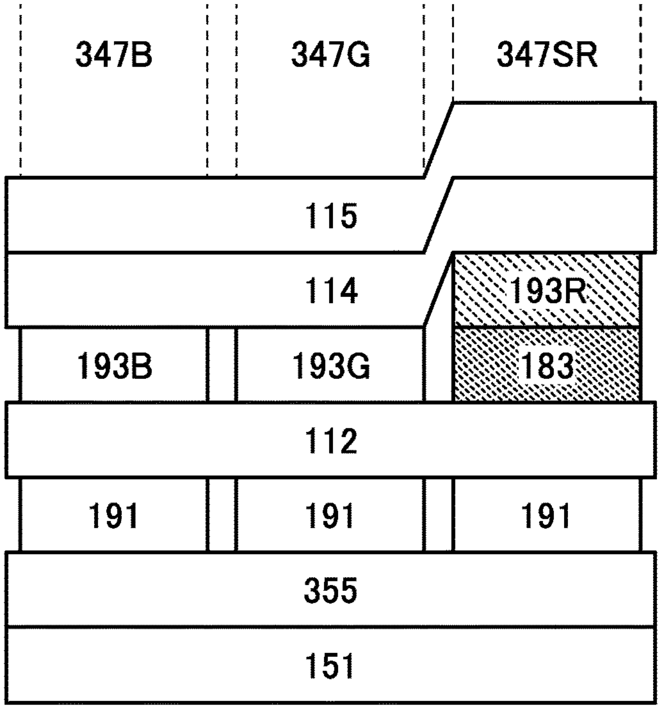

As illustrated in FIG. 18A and FIG. 18B, the light-emitting element 347B, the light-emitting element 347G, and the light-emitting/receiving element 347SR may include common layers between the pair of electrodes. Thus, the light-emitting/receiving element can be incorporated into the display device without a significant increase in the number of manufacturing steps.

The light-emitting element 347B, the light-emitting element 347G, and the light-emitting/receiving element 347SR illustrated in FIG. 18A include a common layer 112 and a common layer 114 in addition to the components illustrated in FIG. 17A and FIG. 17B.

The light-emitting element 347B, the light-emitting element 347G, and the light-emitting/receiving element 347SR illustrated in FIG. 18B are different from those in the structure illustrated in FIG. 17A and FIG. 17B in that the buffer layers 192R, 192G, and 192B and the buffer layers 194R, 194G, and 194B are not included and the common layer 112 and the common layer 114 are included.

The common layer 112 can include one or both of a hole-injection layer and a hole-transport layer. The common layer 114 can include one or both of an electron-injection layer and an electron-transport layer.

The common layer 112 and the common layer 114 may each have a single-layer structure or a stacked-layer structure.

Structure Example 3

Figure 19A:
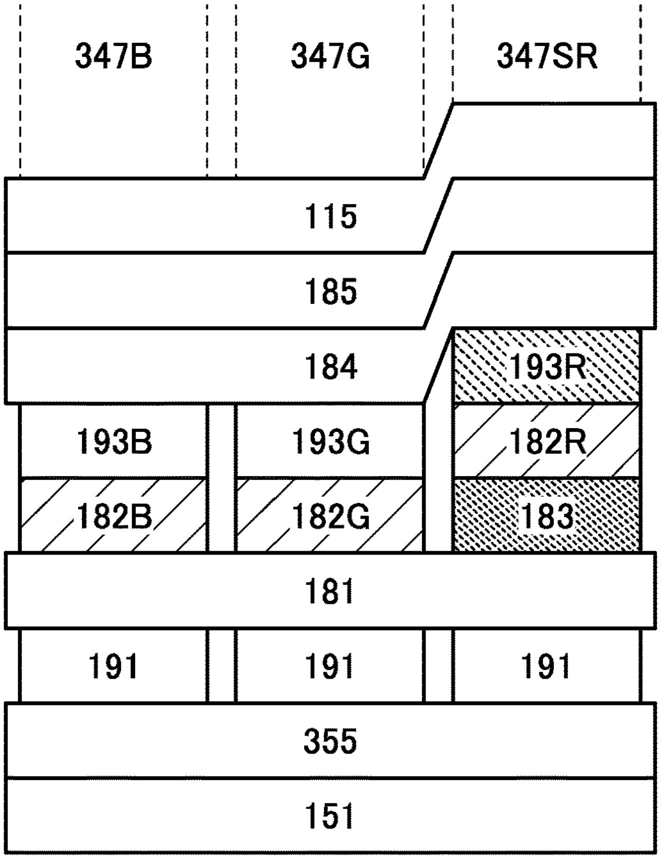
FIG. 19A and FIG. 19B are cross-sectional views illustrating examples of a display device.

A display device illustrated in FIG. 19A is an example in which the light-emitting/receiving element 347SR employs the stacked-layer structure illustrated in FIG. 16C.

The light-emitting/receiving element 347SR includes the hole-injection layer 181, the active layer 183, a hole-transport layer 182R, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting element 347G and the light-emitting element 347B.

The light-emitting element 347G includes the hole-injection layer 181, a hole-transport layer 182G, the light-emitting layer 193G, the electron-transport layer 184, the electron-injection layer 185, and the common electrode 115 in this order over the pixel electrode 191.

The light-emitting element 347B includes the hole-injection layer 181, a hole-transport layer 182B, the light-emitting layer 193B, the electron-transport layer 184, the electron-injection layer 185, and the common electrode 115 in this order over the pixel electrode 191.

The light-emitting element included in the display device of this embodiment preferably employs a microcavity structure. Thus, one of the pair of electrodes of the light-emitting elements is preferably an electrode having properties of transmitting and reflecting visible light (a semi-transmissive and semi-reflective electrode), and the other is preferably an electrode having a property of reflecting visible light (a reflective electrode). When the light-emitting elements have a microcavity structure, light obtained from the light-emitting layers can be resonated between both of the electrodes, whereby light emitted from the light-emitting elements can be intensified.

Note that the semi-transmissive and semi-reflective electrode can have a stacked-layer structure of a reflective electrode and an electrode having a property of transmitting visible light (also referred to as a transparent electrode). In this specification and the like, the reflective electrode functioning as part of a semi-transmissive and semi-reflective electrode may be referred to as a pixel electrode or a common electrode, and the transparent electrode may be referred to as an optical adjustment layer; however, in some cases, the transparent electrode (optical adjustment layer) can also be regarded as having a function of a pixel electrode or a common electrode.

The transparent electrode has a light transmittance higher than or equal to 40%. For example, an electrode whose transmittance for each of visible light (light with a wavelength greater than or equal to 400 nm and less than 750 nm) and near-infrared light (light with a wavelength greater than or equal to 750 nm and less than or equal to 1300 nm) is greater than or equal to 40% is preferably used in the light-emitting element. The reflectance of the semi-transmissive and semi-reflective electrode for each of visible light and near-infrared light is greater than or equal to 10% and less than or equal to 95%, preferably greater than or equal to 30% and less than or equal to 80%. The reflectance of the reflective electrode for each of visible light and near-infrared light is greater than or equal to 40% and less than or equal to 100%, preferably greater than or equal to 70% and less than or equal to 100%. These electrodes preferably have a resistivity less than or equal to $1\times10^{-2}$ Ωcm.

The hole-transport layers 182B, 182G, and 182R may each have a function of an optical adjustment layer. Specifically, the thickness of the hole-transport layer 182B is preferably adjusted such that the optical distance between the pair of electrodes in the light-emitting element 347B intensifies blue light. Similarly, the thickness of the hole-transport layer 182G is preferably adjusted such that the optical distance between the pair of electrodes in the light-emitting element 347G intensifies green light. The thickness of the hole-transport layer 182R is preferably adjusted such that the optical distance between the pair of electrodes in the light-emitting/receiving element 347SR intensifies red light. The layer used as the optical adjustment layer is not limited to the hole-transport layer. Note that when the semi-transmissive and semi-reflective electrode has a stacked-layer structure of a reflective electrode and a transparent electrode, the optical distance between the pair of electrodes represents the optical distance between a pair of reflective electrodes.

Structure Example 4

Figure 19B:
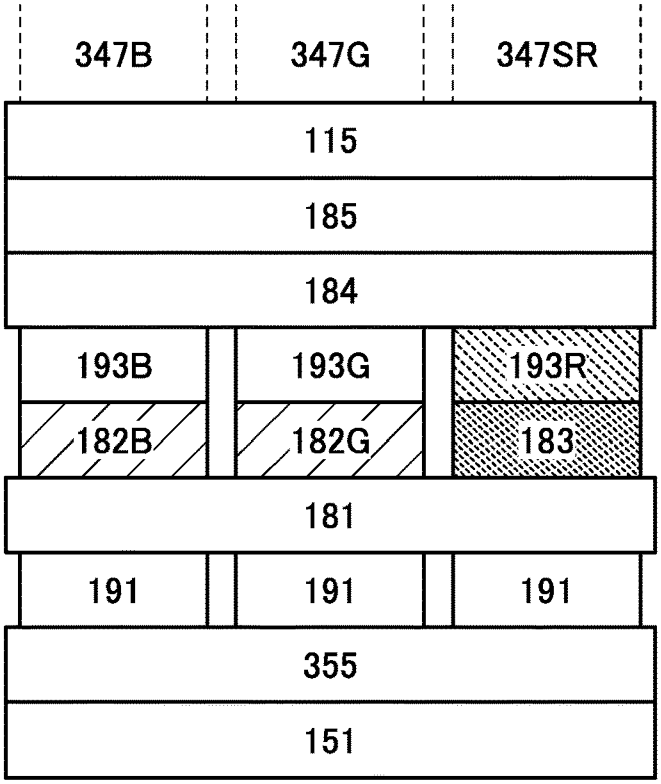

A display device illustrated in FIG. 19B is an example in which the light-emitting/receiving element 347SR employs the stacked-layer structure illustrated in FIG. 16D.

The light-emitting/receiving element 347SR includes the hole-injection layer 181, the active layer 183, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting element 347G and the light-emitting element 347B.

The light-emitting element 347G includes the hole-injection layer 181, the hole-transport layer 182G, the light-emitting layer 193G, the electron-transport layer 184, the electron-injection layer 185, and the common electrode 115 in this order over the pixel electrode 191.

The light-emitting element 347B includes the hole-injection layer 181, the hole-transport layer 182B, the light-emitting layer 193B, the electron-transport layer 184, the electron-injection layer 185, and the common electrode 115 in this order over the pixel electrode 191.

The hole-transport layer is provided in the light-emitting element 347G and the light-emitting element 347B and is not provided in the light-emitting/receiving element 347SR. In this manner, a layer provided in only one of the light-emitting elements and the light-emitting/receiving element may exist in addition to the active layer and the light-emitting layer.

A detailed structure of the display device of one embodiment of the present invention will be described below with reference to FIG. 20 to FIG. 25.

[Display Device 310A]

Figure 20A:
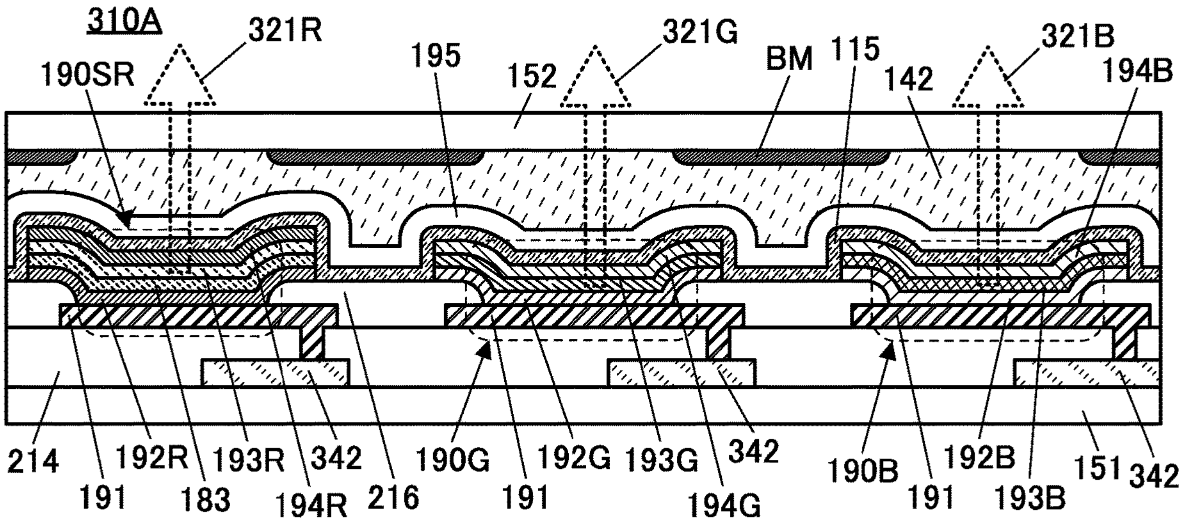
FIG. 20A and FIG. 20B are cross-sectional views illustrating an example of a display device.
Figure 20B:
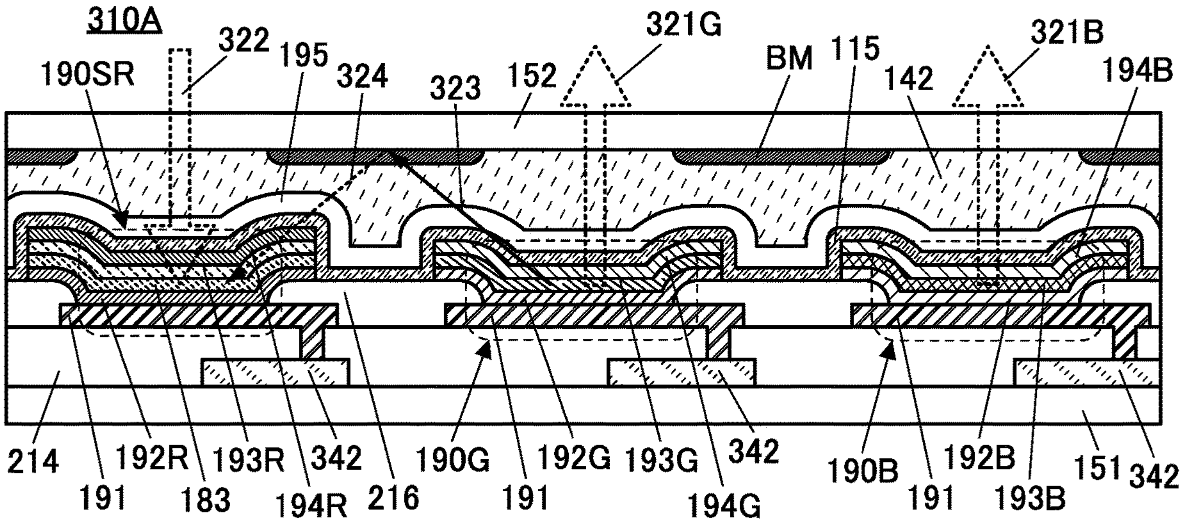

FIG. 20A and FIG. 20B are cross-sectional views of a display device 310A.

The display device 310A includes a light-emitting element 190B, a light-emitting element 190G, and a light-emitting/receiving element 190SR.

The light-emitting element 190B includes the pixel electrode 191, the buffer layer 192B, the light-emitting layer 193B, the buffer layer 194B, and the common electrode 115. The light-emitting element 190B has a function of emitting blue light 321B.

The light-emitting element 190G includes the pixel electrode 191, the buffer layer 192G, the light-emitting layer 193G, the buffer layer 194G, and the common electrode 115. The light-emitting element 190G has a function of emitting green light 321G.

The light-emitting/receiving element 190SR includes the pixel electrode 191, the buffer layer 192R, the active layer 183, the light-emitting layer 193R, the buffer layer 194R, and the common electrode 115. The light-emitting/receiving element 190SR has a function of emitting red light 321R and a function of detecting light 322.

FIG. 20A illustrates the case where the light-emitting/receiving element 190SR functions as a light-emitting element. FIG. 20A illustrates an example in which the light-emitting element 190B emits blue light, the light-emitting element 190G emits green light, and the light-emitting/receiving element 190SR emits red light.

FIG. 20B illustrates the case where the light-emitting/receiving element 190SR functions as a light-receiving element. FIG. 20B illustrates an example in which the light-emitting/receiving element 190SR detects blue light emitted from the light-emitting element 190B and green light emitted from the light-emitting element 190G.

The pixel electrodes 191 are positioned over an insulating layer 214. The end portion of the pixel electrode 191 is covered with a bank 216. Two adjacent pixel electrodes 191 are electrically insulated (also referred to as being electrically isolated) from each other by the bank 216.

An organic insulating film is suitable for the bank 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The bank 216 is a layer that transmits visible light. A bank that blocks visible light may be provided instead of the bank 216.

The display device 310A includes the light-emitting/receiving element 190SR, the light-emitting element 190G, the light-emitting element 190B, a transistor 342, and the like between a pair of substrates (the substrate 151 and a substrate 152).

The light-emitting/receiving element 190SR has a function of detecting light. Specifically, the light-emitting/receiving element 190SR is a photoelectric conversion element that receives the light 322 incident from the outside of the display device 310A and converts the light into an electric signal. The light 322 can also be referred to as light that is emitted from one or both of the light-emitting element 190G and the light-emitting element 190B and then reflected by an object. The light 322 may enter the light-emitting/receiving element 190SR through a lens.

The light-emitting element 190G and the light-emitting element 190B have a function of emitting visible light. Specifically, the light-emitting element 190G and the light-emitting element 190B are each an electroluminescent element that emits light to the substrate 152 side by applying voltage between the pixel electrode 191 and the common electrode 115 (see the light 321G and the light 321B).

The buffer layer 192, the light-emitting layer 193, and the buffer layer 194 can also be referred to as an organic layer (a layer containing an organic compound) or an EL layer. The pixel electrode 191 preferably has a function of reflecting visible light. The common electrode 115 has a function of transmitting visible light.

The pixel electrode 191 is electrically connected to a source or a drain of the transistor 342 through an opening provided in the insulating layer 214. The transistor 342 has a function of controlling the driving of the light-emitting element or the light-emitting/receiving element.

At least part of a circuit electrically connected to the light-emitting/receiving element 190SR is preferably formed using the same material in the same steps as a circuit electrically connected to the light-emitting element 190G and the light-emitting element 190B. In that case, the thickness of the display device can be reduced compared with the case where the two circuits are separately formed, resulting in simplification of the manufacturing steps.

The light-emitting/receiving element 190SR, the light-emitting element 190G, and the light-emitting element 190B are preferably covered with a protective layer 195. In FIG. 20A and the like, the protective layer 195 is provided over and in contact with the common electrode 115. Providing the protective layer 195 can inhibit entry of impurities into the light-emitting/receiving element 190SR and the light-emitting elements of different colors and improve the reliabilities of the light-emitting/receiving element 190SR and the light-emitting elements of the different colors. The protective layer 195 and the substrate 152 are bonded to each other with an adhesive layer 142.

A light-blocking layer BM is provided on a surface of the substrate 152 that faces the substrate 151. The light-blocking layer BM has openings at a position overlapping with the light-emitting element 190G and the light-emitting element 190B, and at a position overlapping with the light-emitting/receiving element 190SR. Note that in this specification and the like, the position overlapping with the light-emitting element 190G or the light-emitting element 190B refers specifically to a position overlapping with a light-emitting region of the light-emitting element 190G or the light-emitting element 190B. Similarly, the position overlapping with the light-emitting/receiving element 190SR refers specifically to a position overlapping with a light-emitting region and a light-receiving region of the light-emitting/receiving element 190SR.

As illustrated in FIG. 20B, the light-emitting/receiving element 190SR is capable of detecting light that is emitted from the light-emitting element 190G or the light-emitting element 190B and then reflected by an object. However, in some cases, light emitted from the light-emitting element 190G or the light-emitting element 190B is reflected inside the display device 310A, and enters the light-emitting/receiving element 190SR without involving an object. The light-blocking layer BM can reduce the influence of such stray light. For example, in the case where the light-blocking layer BM is not provided, light 323 emitted from the light-emitting element 190G is reflected by the substrate 152 and reflected light 324 enters the light-emitting/receiving element 190SR in some cases. Providing the light-blocking layer BM can inhibit the reflected light 324 from entering the light-emitting/receiving element 190SR. Consequently, noise can be reduced, and the sensitivity of a sensor using the light-emitting/receiving element 190 SR can be increased.

For the light-blocking layer BM, a material that blocks light emitted from the light-emitting element can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

[Display Device 310B]

Figure 21A:
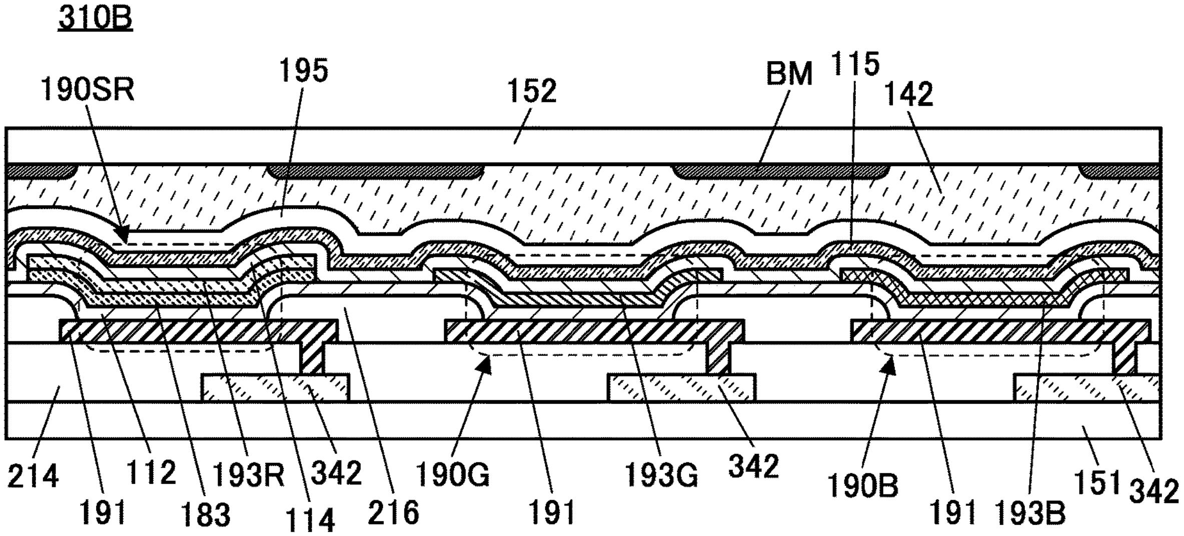
FIG. 21A and FIG. 21B are cross-sectional views illustrating examples of display devices.

A display device 310B illustrated in FIG. 21A is different from the display device 310A in that each of the light-emitting element 190G, the light-emitting element 190B, and the light-emitting/receiving element 190SR does not include the buffer layer 192 and the buffer layer 194 and includes the common layer 112 and the common layer 114. Note that in the following description of the display device below, components similar to those of the above-mentioned display device are not described in some cases.

Note that the stacked-layer structure of the light-emitting element 190B, the light-emitting element 190G, and the light-emitting/receiving element 190SR is not limited to the structures of the display devices 310A and 310B. For example, any of the stacked-layer structures illustrated in FIG. 16 to FIG. 19 can be used for each element, as appropriate.

[Display Device 310C]

Figure 21B:
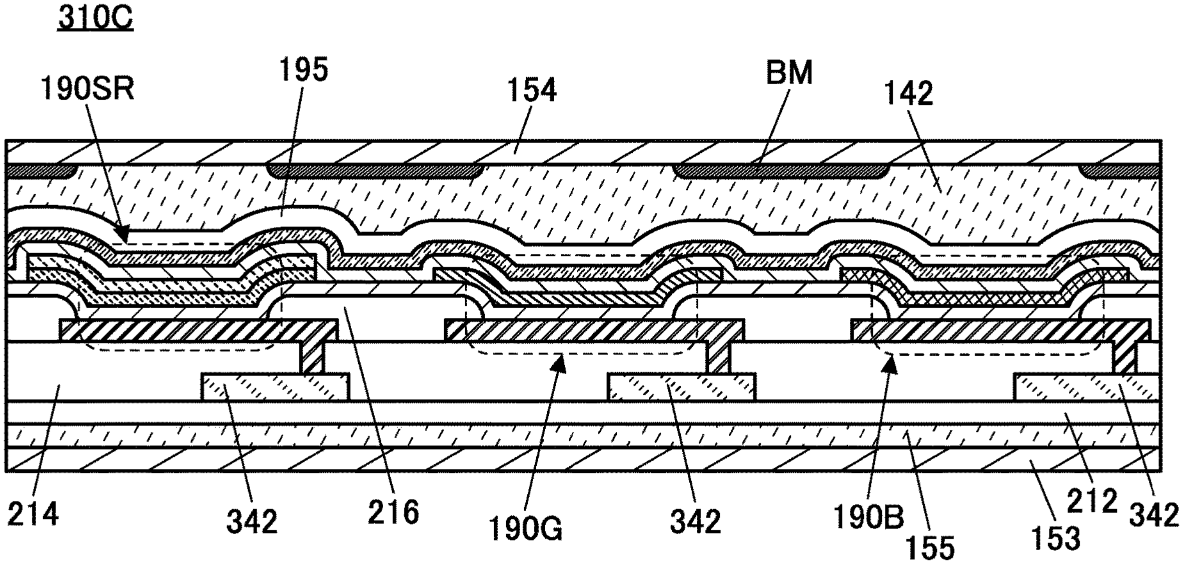

A display device 310C illustrated in FIG. 21B is different from the display device 310B in that the substrate 151 and the substrate 152 are not included and a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display device 310C is formed by transferring, onto the substrate 153, the insulating layer 212, the transistor 342, the light-emitting/receiving element 190SR, the light-emitting element 190G, the light-emitting element 190B, and the like, which are formed over a formation substrate. The substrate 153 and the substrate 154 preferably have flexibility. Accordingly, the flexibility of the display device 310C can be increased. For example, a resin is preferably used for each of the substrate 153 and the substrate 154.

For each of the substrate 153 and the substrate 154, it is possible to use, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber. Glass that is thin enough to have flexibility may be used for one or both of the substrate 153 and the substrate 154.

As the substrate included in the display device of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

A more detailed structure of the display device of one embodiment of the present invention is described below with reference to FIG. 22 to FIG. 25.

[Display Device 100A]

Figure 22:
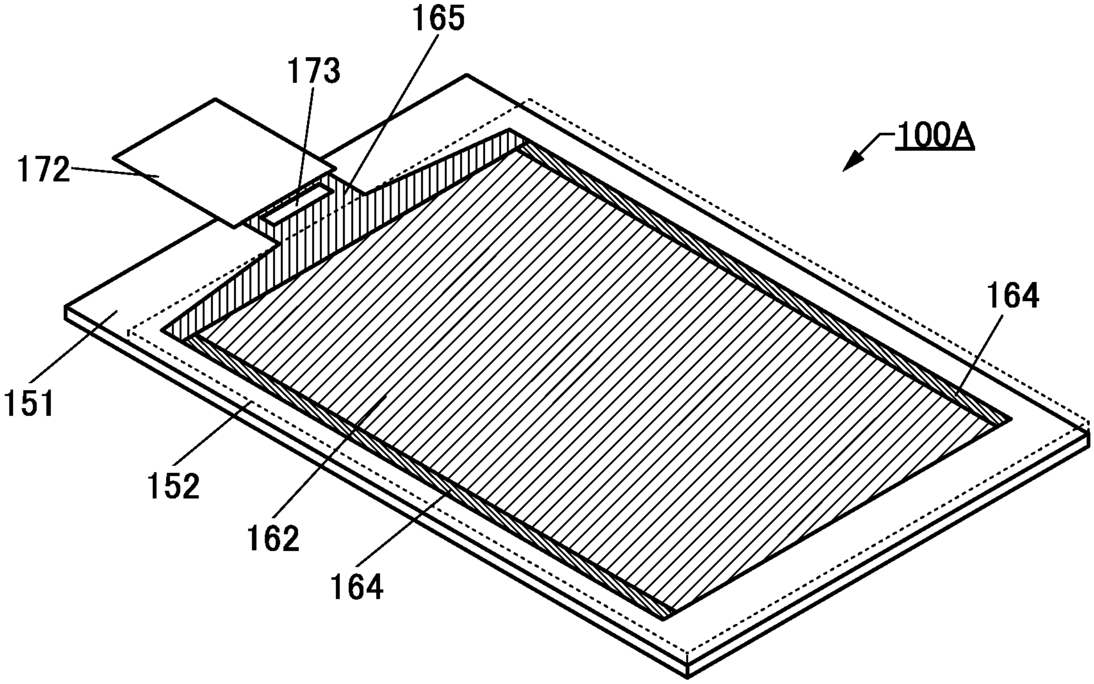
FIG. 22 is a perspective view illustrating an example of a display device.
Figure 23:
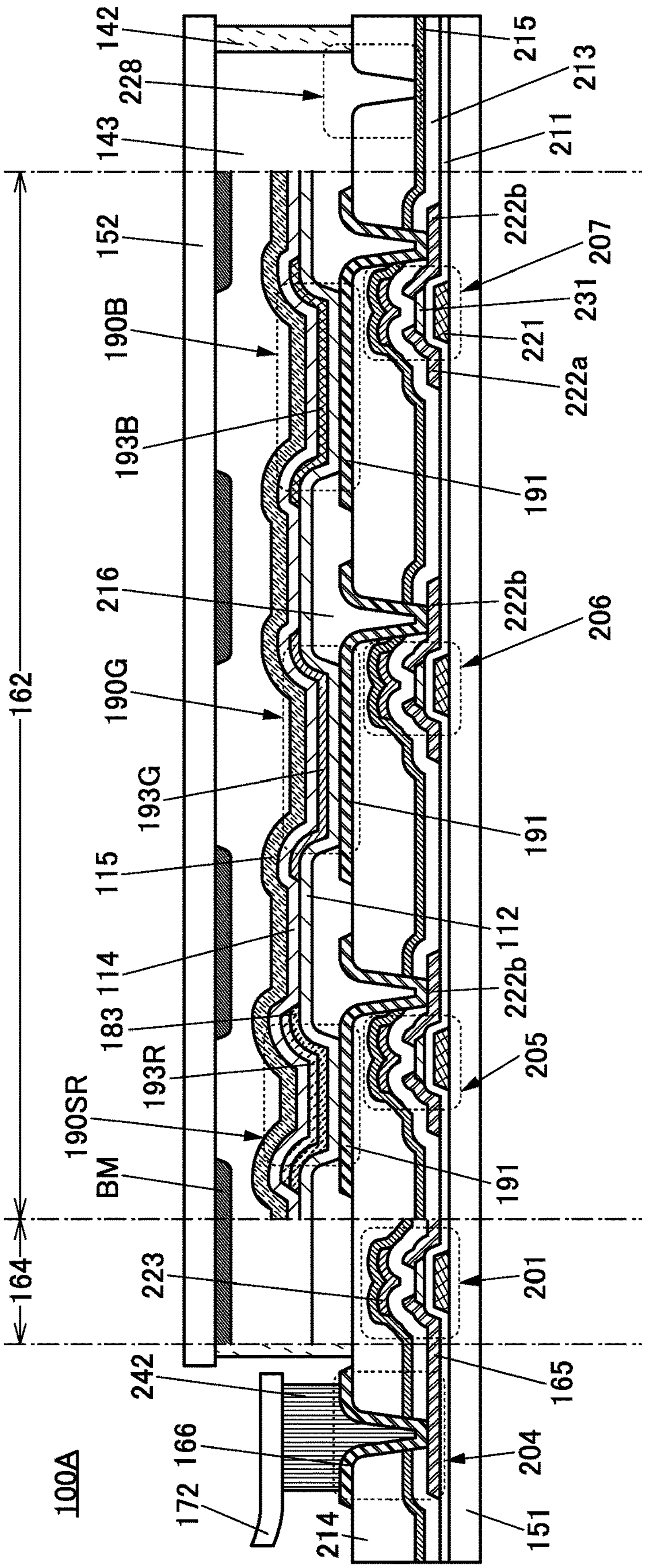
FIG. 23 is a cross-sectional view illustrating an example of a display device.

FIG. 22 is a perspective view of a display device 100A, and FIG. 23 is a cross-sectional view of the display device 100A.

The display device 100A has a structure in which the substrate 152 and the substrate 151 are bonded to each other. In FIG. 22, the substrate 152 is denoted by a dashed line.

The display device 100A includes a display portion 162, a circuit 164, a wiring 165, and the like. FIG. 22 illustrates an example in which the display device 100A is provided with an IC (integrated circuit) 173 and an FPC 172. Thus, the structure illustrated in FIG. 22 can be regarded as a display module including the display device 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or input to the wiring 165 from the IC 173.

FIG. 22 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display device 100A and the display module may have a structure not including an IC. The IC may be mounted on the FPC by a COF method or the like.

FIG. 23 illustrates an example of cross sections of part of a region including the FPC 172, part of a region including the circuit 164, part of a region including the display portion 162, and part of a region including an end portion of the display device 100A illustrated in FIG. 22.

The display device 100A illustrated in FIG. 23 includes a transistor 201, a transistor 205, a transistor 206, a transistor 207, the light-emitting element 190B, the light-emitting element 190G, the light-emitting/receiving element 190SR, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting element 190B, the light-emitting element 190G, and the light-emitting/receiving element 190SR. In FIG. 23, a hollow sealing structure is employed in which a space 143 surrounded by the substrate 152, the adhesive layer 142, and the insulating layer 214 is filled with an inert gas (e.g., nitrogen or argon). The adhesive layer 142 may be provided to overlap with the light-emitting element 190B, the light-emitting element 190G, and the light-emitting/receiving element 190SR. The space 143 surrounded by the substrate 152, the adhesive layer 142, and the insulating layer 214 may be filled with a resin different from that of the adhesive layer 142.

The light-emitting element 190B has a stacked-layer structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222*b* included in the transistor 207 through an opening provided in the insulating layer 214. The transistor 207 has a function of controlling the driving of the light-emitting element 190B. The end portion of the pixel electrode 191 is covered with the bank 216. The pixel electrode 191 contains a material that reflects visible light, and the common electrode 115 contains a material that transmits visible light.

The light-emitting element 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222*b* included in the transistor 206 through an opening provided in the insulating layer 214. The transistor 206 has a function of controlling the driving of the light-emitting element 190G.

The light-emitting/receiving element 190SR has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222*b* included in the transistor 205 through an opening provided in the insulating layer 214. The transistor 205 has a function of controlling the driving of the light-emitting/receiving element 190SR.

Light emitted from the light-emitting element 190B, the light-emitting element 190G, and the light-emitting/receiving element 190SR is emitted toward the substrate 152 side. Light enters the light-emitting/receiving element 190SR through the substrate 152 and the space 143. For the substrate 152, a material that has a high visible-light-transmitting property is preferably used.

The pixel electrodes 191 can be formed using the same material in the same step. The common layer 112, the common layer 114, and the common electrode 115 are used in common in the light-emitting element 190B, the light-emitting element 190G, and the light-emitting/receiving element 190SR. The light-emitting/receiving element 190SR has the structure of a red-light-emitting element to which the active layer 183 is added. Alternatively, the light-emitting element 190B, the light-emitting element 190G, and the light-emitting/receiving element 190SR can have a common structure except for the structures of the active layer 183 and the light-emitting layer 193 of each color. Thus, the display portion 162 of the display device 100A can have a light-receiving function without a significant increase in the number of manufacturing steps.

The light-blocking layer BM is provided on a surface of the substrate 152 that faces the substrate 151. The light-blocking layer BM includes openings in positions overlapping with the light-emitting element 190B, the light-emitting element 190G, and the light-emitting/receiving element 190SR. Providing the light-blocking layer BM can control the range where the light-emitting/receiving element 190SR detects light. Furthermore, with the light-blocking layer BM, light can be inhibited from directly entering the light-emitting/receiving element 190SR from the light-emitting element 190G or the light-emitting element 190B without involving any object. Hence, a sensor with less noise and high sensitivity can be obtained.

The transistor 201, the transistor 205, the transistor 206, and the transistor 207 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be either a single layer or two or more layers.

A material into which impurities such as water, hydrogen, or the like do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like, which is an inorganic insulating film, can be used. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed such that an end portion of the organic insulating film is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 23, an opening is formed in the insulating layer 214. This can inhibit entry of impurities into the display portion 162 from the outside through the insulating layer 214 even when an organic insulating film is used as the insulating layer 214. Thus, the reliability of the display device 100A can be increased.

Each of the transistor 201, the transistor 205, the transistor 206, and the transistor 207 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of each of the transistors preferably includes a metal oxide (also referred to as an oxide semiconductor). Alternatively, the semiconductor layer of each of the transistors may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer. Alternatively, it is preferable to use an oxide containing indium, gallium, zinc, and tin. Alternatively, it is preferable to use an oxide containing indium and zinc.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=10:1:3 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that does not overlap with the substrate 152. In the connection portion 204, the wiring 165 is electrically connected to the FPC 172 through a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outer side of the substrate 152.

For each of the substrate 151 and the substrate 152, glass, quartz, ceramic, sapphire, resin, or the like can be used. When a flexible material is used for the substrate 151 and the substrate 152, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

Examples of materials that can be used for the gates, the sources, and the drains of the transistors and the conductive layers such as a variety of wirings and electrodes included in the display device include metals such as aluminum, titanium, chromium, nickel, copper, yttrium, zirconium, molybdenum, silver, tantalum, and tungsten, and an alloy containing any of these metals as its main component. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to give a light-transmitting property. A stacked-layer film of any of the above materials can be used as a conductive layer. For example, a stacked-layer film of indium tin oxide and an alloy of silver and magnesium, or the like is preferably used, in which case the conductivity can be increased. These materials can also be used for the conductive layers such as a variety of wirings and electrodes included in the display device, the conductive layers (e.g., the conductive layers functioning as the pixel electrode, the common electrode, and the like) included in the light-emitting element and the light-emitting/receiving element, and the like.

Examples of an insulating material that can be used for each insulating layer include a resin such as an acrylic resin or an epoxy resin, and an inorganic insulating material such as silicon oxide, silicon oxynitride, silicon nitride oxide, silicon nitride, or aluminum oxide.

[Display Device 100B]

Figure 24:
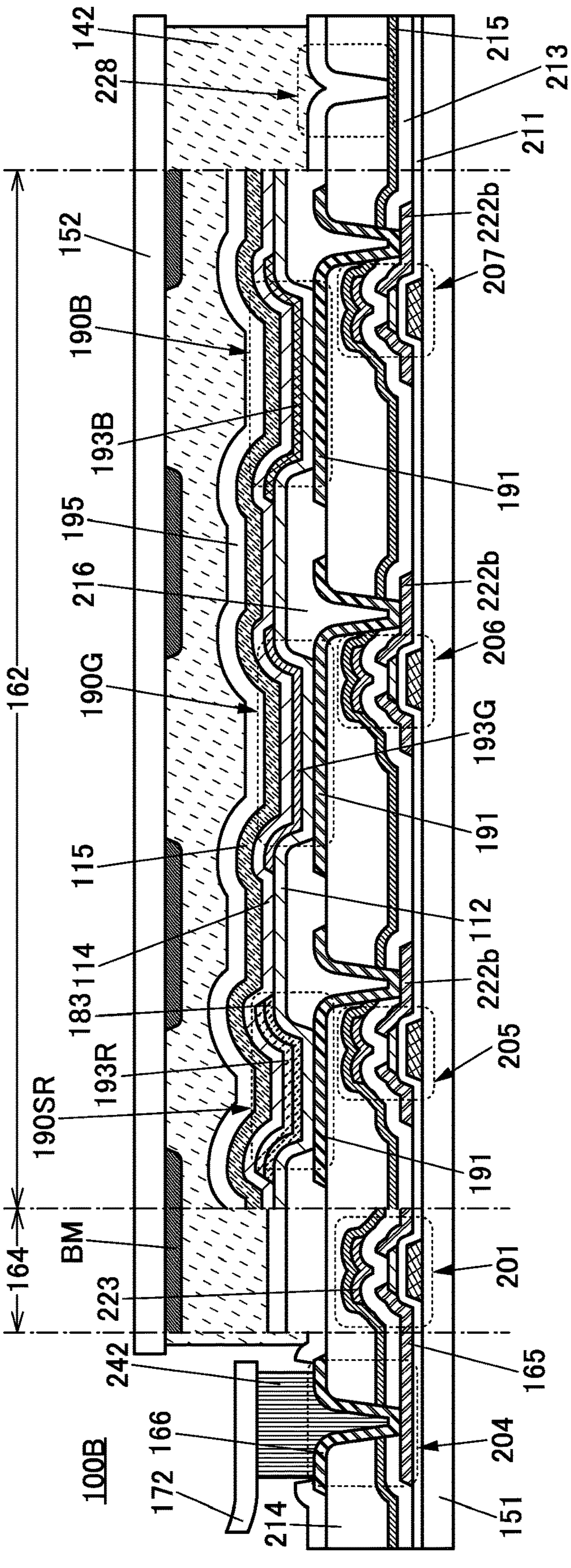
FIG. 24 is a cross-sectional view illustrating an example of a display device.

FIG. 24 is a cross-sectional view of a display device 100B.

The display device 100B is different from the display device 100A mainly in including the protective layer 195. Detailed description of a structure similar to that of the display device 100A is omitted.

Providing the protective layer 195 that covers the light-emitting element 190B, the light-emitting element 190G, and the light-emitting/receiving element 190SR can inhibit entry of impurities such as water into the light-emitting element 190B, the light-emitting element 190G, and the light-emitting/receiving element 190SR, leading to an increase in the reliability of the light-emitting element 190B, the light-emitting element 190G, and the light-emitting/receiving element 190SR.

In the region 228 in the vicinity of an end portion of the display device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through an organic insulating film can be inhibited. Consequently, the reliability of the display device 100B can be increased.

The protective layer 195 may have a single-layer structure or a stacked-layer structure; for example, the protective layer 195 may have a three-layer structure that includes an inorganic insulating layer over the common electrode 115, an organic insulating layer over the inorganic insulating layer, and an inorganic insulating layer over the organic insulating layer. In that case, an end portion of the inorganic insulating film preferably extends beyond an end portion of the organic insulating film.

Furthermore, a lens may be provided in a region overlapping with the light-emitting/receiving element 190SR. Thus, the sensitivity and accuracy of a sensor using the light-emitting/receiving element 190 SR can be increased.

The lens preferably has a refractive index of greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, or the like can be used for the lens. Alternatively, a material containing a resin and nanoparticles of a material having a higher refractive index than the resin can be used for the lens. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, or the like can be used for the lens. Alternatively, zinc sulfide or the like can be used for the lens.

In the display device 100B, the protective layer 195 and the substrate 152 are bonded to each other with the adhesive layer 142. The adhesive layer 142 is provided to overlap with the light-emitting element 190B, the light-emitting element 190G, and the light-emitting/receiving element 190SR; that is, the display device 100B employs a solid sealing structure.

[Display Device 100C]

Figure 25A:
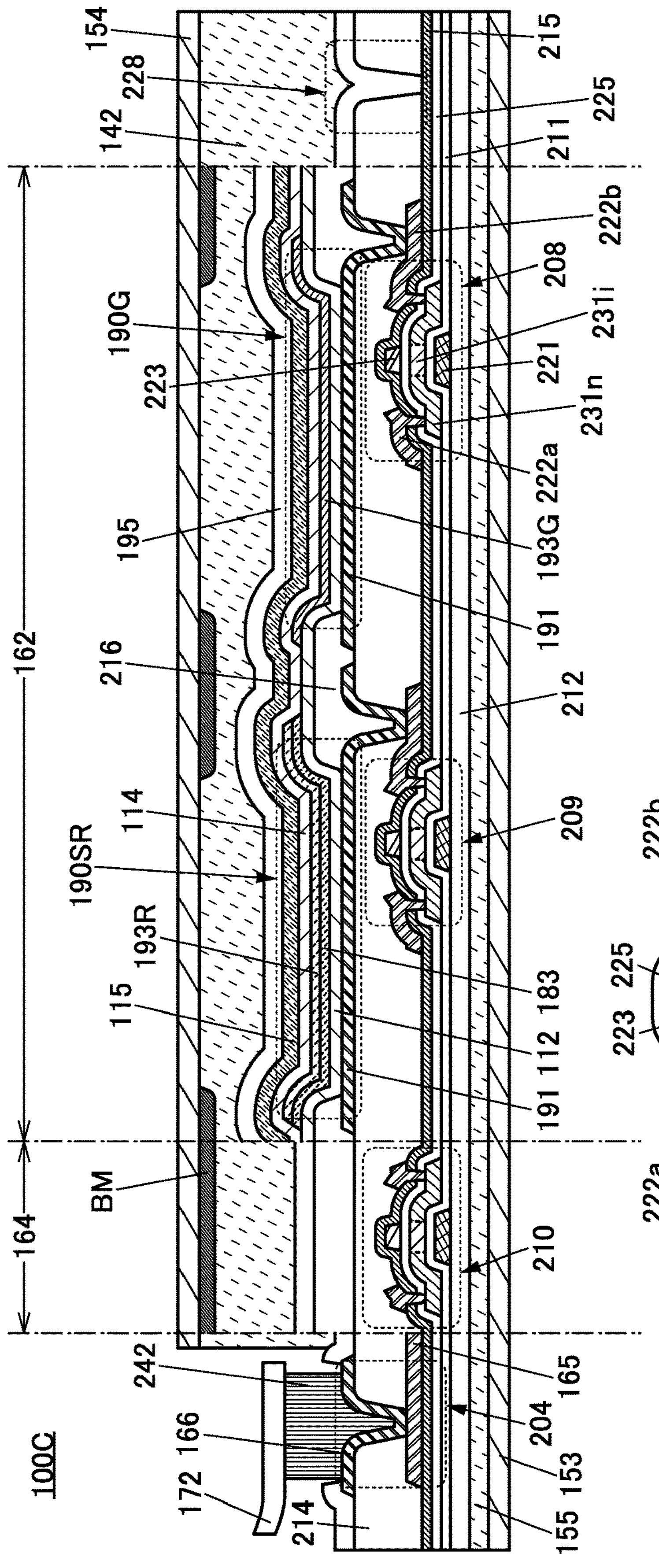
FIG. 25A is a cross-sectional view illustrating an example of a display device.

FIG. 25A is a cross-sectional view of a display device 100C.

The display device 100C is different from the display device 100B in transistor structures.

The display device 100C includes a transistor 208, a transistor 209, and a transistor 210 over the substrate 151.

The transistor 208, the transistor 209, and the transistor 210 each include the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* serves as a source, and the other serves as a drain.

The pixel electrode 191 of the light-emitting element 190G is electrically connected to one of the pair of low-resistance regions 231*n* of the transistor 208 through the conductive layer 222*b*.

The pixel electrode 191 of the light-emitting/receiving element 190SR is electrically connected to the other of the pair of low-resistance regions 231*n* of the transistor 209 through the conductive layer 222*b*.

Figure 25B:
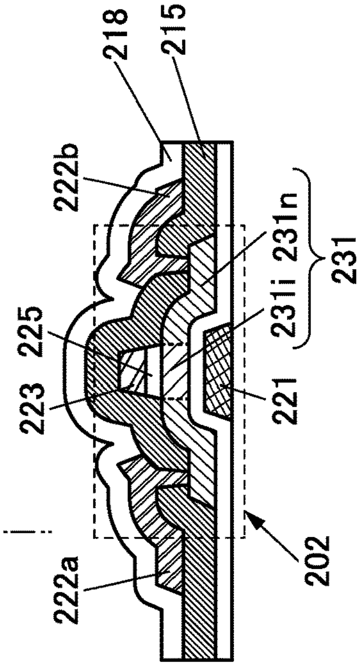
FIG. 25B is a cross-sectional view illustrating an example of a transistor.

FIG. 25A illustrates an example in which the insulating layer 225 covers a top surface and a side surface of the semiconductor layer. Meanwhile, in a transistor 202 illustrated in FIG. 25B, the insulating layer 225 overlaps with the channel formation region 231*i* of the semiconductor layer 231 and does not overlap with the low-resistance regions 231*n*. The structure illustrated in FIG. 25B can be manufactured by processing the insulating layer 225 using the conductive layer 223 as a mask, for example. In FIG. 25B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

In addition, the display device 100C is different from the display device 100B in that the substrate 151 and the substrate 152 are not included and the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display device 100C is formed by transferring, onto the substrate 153, the insulating layer 212, the transistor 208, the transistor 209, the transistor 210, the light-emitting/receiving element 190SR, the light-emitting element 190G, and the like, which are formed over a formation substrate. The substrate 153 and the substrate 154 preferably have flexibility. Accordingly, the flexibility of the display device 100C can be increased.

The inorganic insulating film that can be used as the insulating layer 211, the insulating layer 213, and the insulating layer 215 can be used as the insulating layer 212.

In the display device of this embodiment, a subpixel exhibiting light of any of the colors includes a light-emitting/receiving element instead of a light-emitting element as described above. The light-emitting/receiving element functions as both a light-emitting element and a light-receiving element, whereby the pixel can have a light-receiving function without an increase in the number of subpixels included in the pixel. Moreover, the pixel can have a light-receiving function without a reduction in the definition of the display device, a reduction in the aperture ratio of each subpixel, or the like.

At least part of this embodiment can be implemented in combination with the other embodiments described in this specification as appropriate.

Embodiment 3

Described in this embodiment is a metal oxide (also referred to as an oxide semiconductor) that can be used in the OS transistor described in the above embodiment.

The metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including completely amorphous), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as being amorphous unless it has a bilaterally symmetrical peak in the XRD spectrum.

The crystal structure of the film or the substrate can also be evaluated with a diffraction pattern observed by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter an In layer) and a layer containing the element M, zinc (Zn), and oxygen (hereinafter an (M,Zn) layer) are stacked. Note that Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to, for example, a low density of arrangement of oxygen atoms in the a-b plane direction or an interatomic bond distance changed by substitution of a metal atom or the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions exist randomly to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas in deposition is preferably as low as possible; for example, the ratio of the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

By contrast, the second region has a higher insulating property than the first region. In other words, when the second regions are distributed in a metal oxide, leakage current can be inhibited.

Thus, in the case where the CAC-OS is used for a transistor, by the complementary function of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ) and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ cm$^{-3}$. Note that in order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

In addition, a highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to stabilize electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon, carbon, or the like, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are each set lower than or equal to $2\times10^{18}$ atoms/cm$^3$, preferably lower than or equal to $2\times10^{17}$ atoms/cm$^3$.

In addition, when the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained using SIMS, is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 4

In this embodiment, electronic devices of embodiments of the present invention are described with reference to FIG. 26 to FIG. 28.

An electronic device in this embodiment includes the display device of one embodiment of the present invention. For example, the display device of one embodiment of the present invention can be used in a display portion of the electronic device. The display device of one embodiment of the present invention has a function of detecting light, and thus can perform biological authentication with the display portion or detect a touch operation (a contact or an approach), for example. Consequently, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 26A:
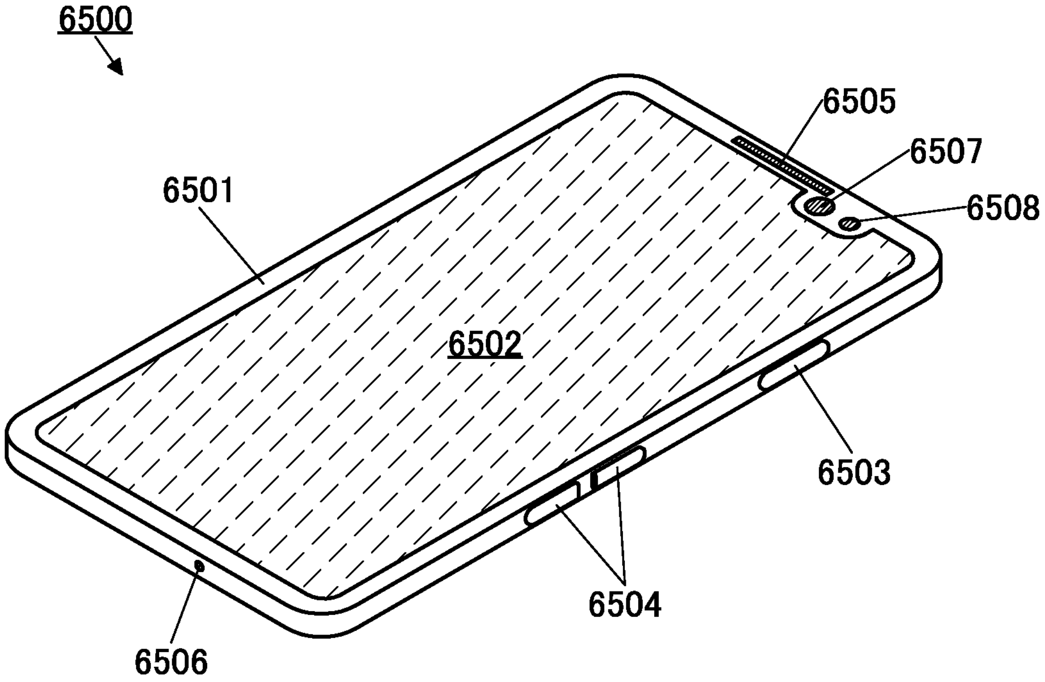
FIG. 26A and FIG. 26B are diagrams illustrating an example of an electronic device.

An electronic device 6500 illustrated in FIG. 26A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 26B:
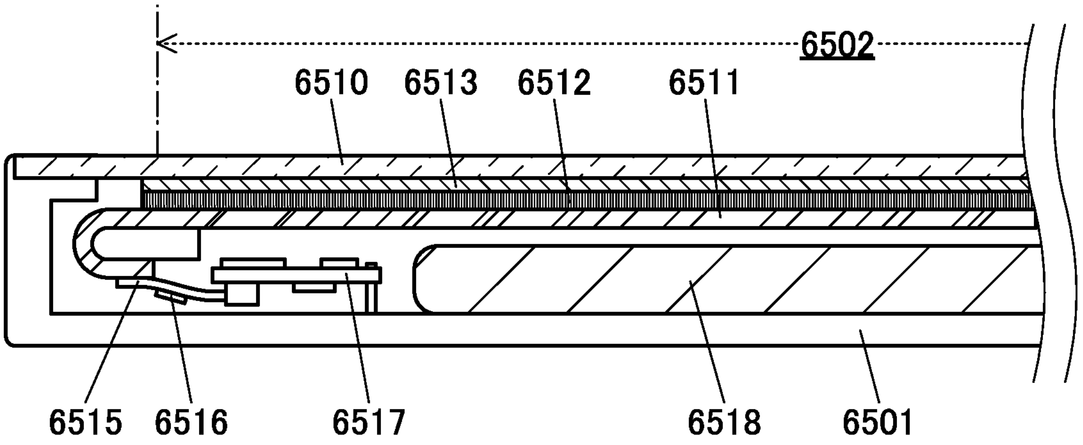

FIG. 26B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display device of one embodiment of the present invention as the display panel 6511 allows image capturing with the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 27A:
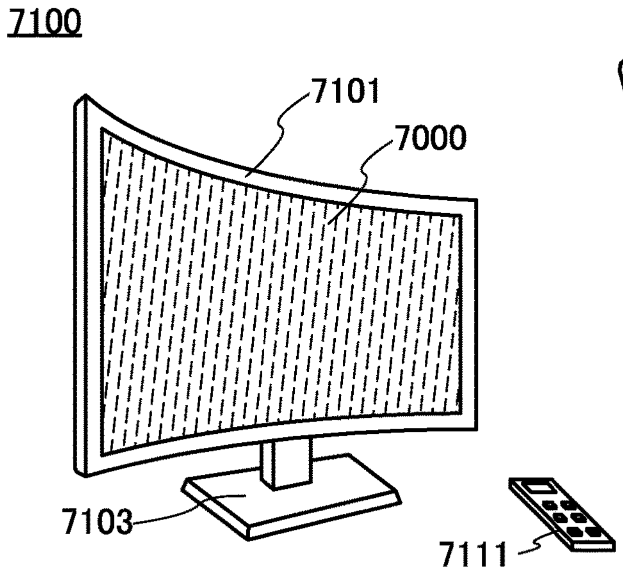
FIG. 27A to FIG. 27D are diagrams illustrating examples of electronic devices.

FIG. 27A illustrates an example of a television device. In a television device 7100, a display portion 7000 is incorporated in a housing 7101. Here, a structure in which the housing 7101 is supported by a stand 7103 is illustrated.

A display device of one embodiment of the present invention can be used in the display portion 7000.

Operation of the television device 7100 illustrated in FIG. 27A can be performed with an operation switch provided in the housing 7101, a separate remote controller 7111, or the like. Alternatively, the display portion 7000 may include a touch sensor, and the television device 7100 may be operated by a touch on the display portion 7000 with a finger or the like. The remote controller 7111 may include a display portion for displaying information output from the remote controller 7111. With operation keys or a touch panel provided in the remote controller 7111, channels and volume can be operated and images displayed on the display portion 7000 can be operated.

Note that the television device 7100 has a structure in which a receiver, a modem, and the like are provided. With use of the receiver, general television broadcasting can be received. When the television device is connected to a communication network with or without wires via the modem, one-way (from a transmitter to a receiver) or two-way (between a transmitter and a receiver or between receivers, for example) information communication can also be performed.

Figure 27B:
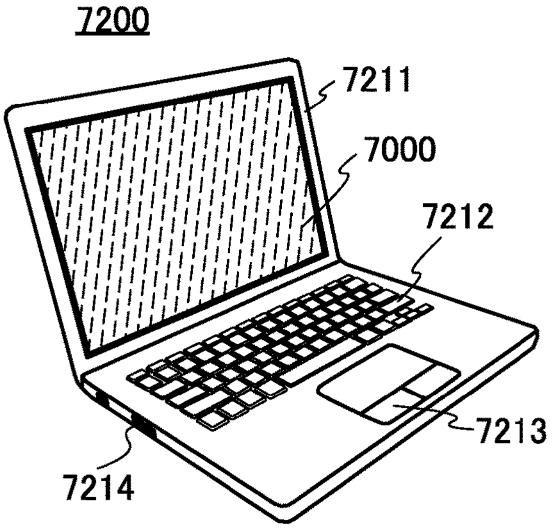

FIG. 27B illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000.

Figure 27C:
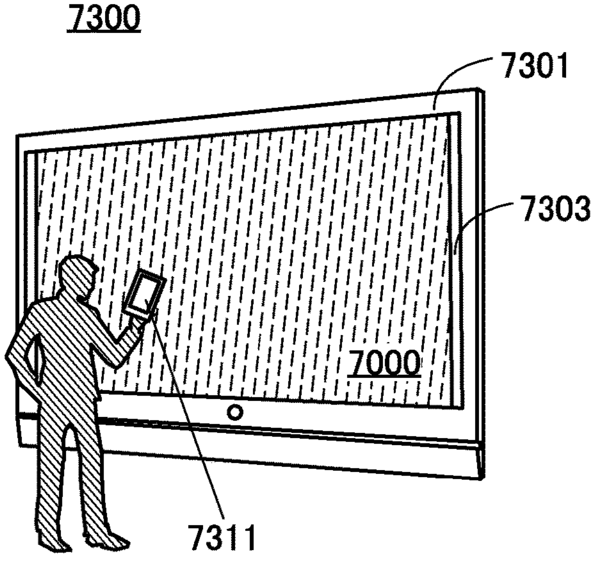
Figure 27D:
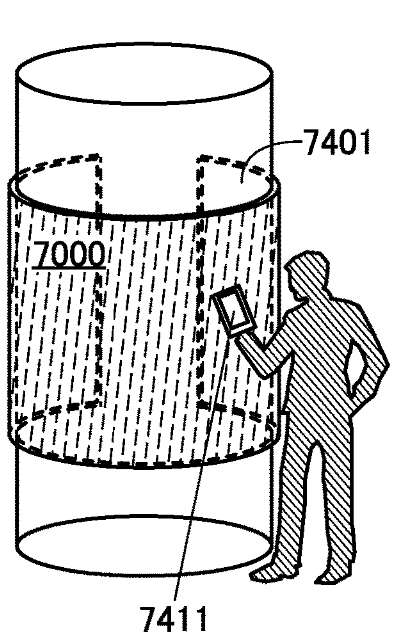

FIG. 27C and FIG. 27D illustrate examples of digital signage.

Digital signage 7300 illustrated in FIG. 27C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 27D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 27C and FIG. 27D.

A larger area of the display portion 7000 can increase the amount of information that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 27C and FIG. 27D, it is preferable that the digital signage 7300 or the digital signage 7400 can work with an information terminal 7311 or an information terminal 7411, such as a user's smartphone, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 28A to FIG. 28F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 28A to FIG. 28F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera and the like and have a function of taking a still image, a moving image, and the like, a function of storing the taken image in a recording medium (an external recording medium or a recording medium incorporated in the camera), a function of displaying the taken image on the display portion, or the like.

The details of the electronic devices illustrated in FIG. 28A to FIG. 28F are described below.

Figure 28A:
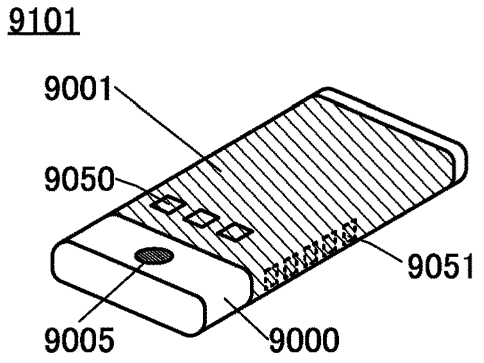
FIG. 28A to FIG. 28F are diagrams illustrating examples of electronic devices.

FIG. 28A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display characters, image information, or the like on its plurality of surfaces. FIG. 28A illustrates an example where three icons 9050 are displayed. Information 9051 indicated by dashed rectangles can be displayed on another surface of the display portion 9001. Examples of the information 9051 include notification of reception of an e-mail, SNS, an incoming call, or the like, the title and sender of an e-mail, SNS, or the like, the date, the time, remaining battery, and the reception strength of an antenna. Alternatively, the icon 9050 or the like may be displayed at the position where the information 9051 is displayed.

Figure 28B:
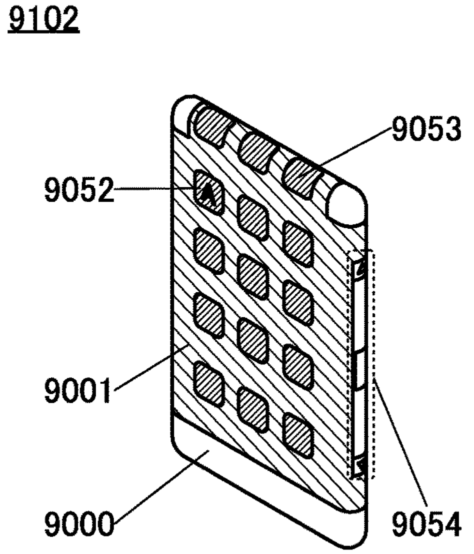

FIG. 28B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, a user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 28C:
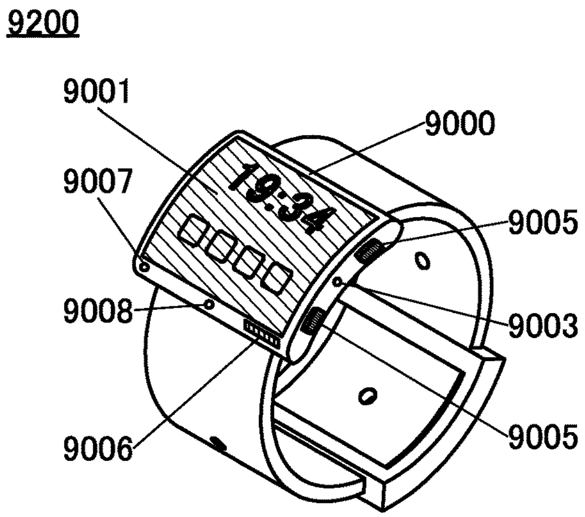

FIG. 28C is a perspective view illustrating a watch-type portable information terminal 9200. The display portion 9001 is provided such that its display surface is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal, charging, and the like. Note that the charging operation may be performed by wireless power feeding.

Figure 28D:
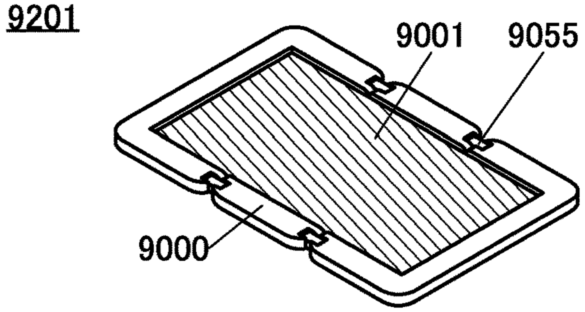
Figure 28E:
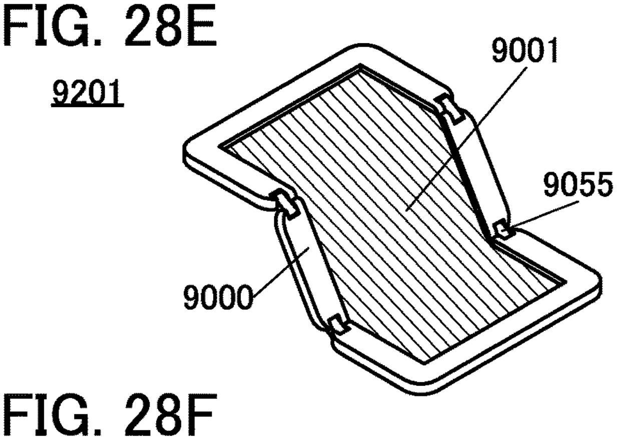
Figure 28F:
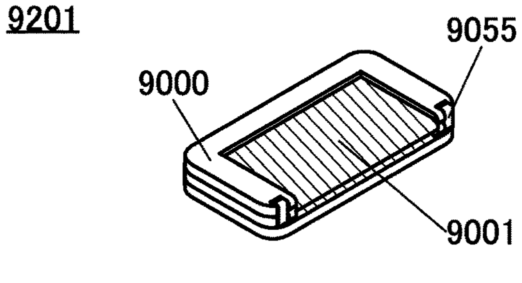

FIG. 28D to FIG. 28F are perspective views illustrating a foldable portable information terminal 9201. FIG. 28D is a perspective view of an opened state of the portable information terminal 9201, FIG. 28F is a perspective view of a folded state thereof, and FIG. 28E is a perspective view of a state in the middle of change from one of FIG. 28D and FIG. 28F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of this embodiment can be implemented in combination with the other embodiments described in this specification as appropriate.

REFERENCE NUMERALS

Tr1: transistor: SW1: switch: SW2: switch: SW3: switch: SW4: switch: SA: light-emitting/receiving element: CS: capacitor: AL: wiring: CL: wiring: WX: wiring: SL: wiring: $V_{data}$: data potential: $V_{gp}$: potential: $V_{gs}$: voltage: $V_{off}$: potential: $V_{RS}$: potential: $V_{sig}$: potential: SL1: wiring: SL2: wiring: SL3: wiring: GL: wiring: SE: wiring: AEN: wiring: REN: wiring: SR: light-emitting/receiving element: ELB: light-emitting element: ELG: light-emitting element: M1: transistor: M2: transistor: M3: transistor: M4: transistor: M5: transistor: M6: transistor: 10: display device: 11: display portion: 12: driver circuit portion: 13: driver circuit portion: 14: driver circuit portion: 15: circuit portion: 20R: pixel: 20B: pixel: 20G: pixel: 21R: circuit: 21B: circuit: 21G: circuit: 30: pixel: 30A: pixel: 30B: pixel: 30G: pixel

The invention claimed is:

1. A display device comprising:

first to fourth switches, a first transistor, a capacitor, a light-emitting/receiving element, and first to fourth wirings, wherein the first wiring is electrically connected to a gate of the first transistor through the first switch, wherein the second wiring is electrically connected to one of a source and a drain of the first transistor through the second switch, wherein an anode of the light-emitting/receiving element is electrically connected to the other of the source and the drain of the first transistor through the third switch, wherein a cathode of the light-emitting/receiving element is electrically connected to the third wiring, wherein the fourth wiring is electrically connected to the other of the source and the drain of the first transistor through the fourth switch, wherein one electrode of the capacitor is electrically connected to the gate of the first transistor, wherein the other electrode of the capacitor is electrically connected to the other of the source and the drain of the first transistor, wherein a first potential is supplied to the second wiring, wherein a second potential lower than the first potential is supplied to the third wiring, and wherein the light-emitting/receiving element is configured to emit light of a first color and to convert light of a second color into an electric signal.

2. The display device according to claim 1, wherein the first to fourth switches are in a conducting state, a data potential is supplied to the first wiring, and a third potential is supplied to the fourth wiring in a first period, and wherein the first to fourth switches are in a non-conducting state in a second period.

3. The display device according to claim 1, wherein the first switch, the third switch, and the fourth switch are in a conducting state, the second switch is in a non-conducting state, a fourth potential lower than the first potential is supplied to the first wiring, and a fifth potential lower than the second potential is supplied to the fourth wiring in a third period, wherein the first switch and the third switch are in a conducting state, the second switch and the fourth switch are in a non-conducting state, and a sixth potential higher than the second potential is supplied to the first wiring in a fourth period, and wherein the first switch and the third switch are in a non-conducting state, and the second switch and the fourth switch are in a conducting state in a fifth period.

4. A display device comprising:

first to fifth transistors, a capacitor, a light-emitting/receiving element, and first to fourth wirings, wherein one of a source and a drain of the second transistor is electrically connected to the first wiring, wherein the other of the source and the drain of the second transistor is electrically connected to a gate of the first transistor, wherein one of a source and a drain of the third transistor is electrically connected to the second wiring, wherein the other of the source and the drain of the third transistor is electrically connected to one of a source and a drain of the first transistor, wherein one of a source and a drain of the fourth transistor is electrically connected to the other of the source and the drain of the first transistor, wherein the other of the source and the drain of the fourth transistor is electrically connected to an anode of the light-emitting/receiving element, wherein a cathode of the light-emitting/receiving element is electrically connected to the third wiring, wherein one of a source and a drain of the fifth transistor is electrically connected to the other of the source and the drain of the first transistor, wherein the other of the source and the drain of the fifth transistor is electrically connected to the fourth wiring, wherein one electrode of the capacitor is electrically connected to the gate of the first transistor, wherein the other electrode of the capacitor is electrically connected to the other of the source and the drain of the first transistor, wherein a first potential is supplied to the second wiring, wherein a second potential lower than the first potential is supplied to the third wiring, and wherein the light-emitting/receiving element is configured to emit light of a first color and to convert light of a second color into an electric signal.

5. The display device according to claim 1, wherein the first transistor further comprises a back gate.

6. The display device according to claim 1, further comprising a light-emitting element configured to emit light of the second color, wherein the light-emitting/receiving element and the light-emitting element are positioned over the same substrate, and wherein the light-emitting element is not configured to convert light into an electric signal.

7. The display device according to claim 1, further comprising a light-emitting element configured to emit light of the second color, wherein the light-emitting/receiving element comprises a first pixel electrode, a first light-emitting layer, an active layer, and a first electrode, wherein the light-emitting element comprises a second pixel electrode, a second light-emitting layer, and the first electrode, and wherein the light-emitting element is not configured to convert light into an electric signal.

8. The display device according to claim 7, wherein the first pixel electrode and the second pixel electrode are formed from the same conductive film.

9. The display device according to claim 4, wherein at least one of the first to fifth transistors further comprises a back gate.

10. The display device according to claim 4, further comprising a light-emitting element configured to emit light of the second color, wherein the light-emitting/receiving element and the light-emitting element are positioned over the same substrate, and wherein the light-emitting element is not configured to convert light into an electric signal.

11. The display device according to claim 4, further comprising a light-emitting element configured to emit light of the second color, wherein the light-emitting/receiving element comprises a first pixel electrode, a first light-emitting layer, an active layer, and a first electrode, wherein the light-emitting element comprises a second pixel electrode, a second light-emitting layer, and the first electrode, and wherein the light-emitting element is not configured to convert light into an electric signal.

12. The display device according to claim 11, wherein the first pixel electrode and the second pixel electrode are formed from the same conductive film.

* * * * *